(12) United States Patent
Bell

(10) Patent No.: US 10,734,044 B2
(45) Date of Patent: Aug. 4, 2020

(54) APPARATUSES AND METHODS FOR LATCHING DATA INPUT BITS

(71) Applicant: MICRON TECHNOLOGY, INC., Boise, ID (US)

(72) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/103,151

(22) Filed: Aug. 14, 2018

(65) Prior Publication Data

US 2020/0058333 A1 Feb. 20, 2020

(51) Int. Cl.
*G11C 7/22* (2006.01)
*G11C 7/12* (2006.01)
*G11C 11/4076* (2006.01)
*G11C 7/10* (2006.01)

(52) U.S. Cl.
CPC .............. *G11C 7/22* (2013.01); *G11C 7/1072* (2013.01); *G11C 7/1078* (2013.01); *G11C 7/12* (2013.01); *G11C 11/4076* (2013.01)

(58) Field of Classification Search
None
See application file for complete search history.

(56) References Cited

U.S. PATENT DOCUMENTS

| 2002/0122348 A1* | 9/2002 | Lee | G11C 7/1066 365/233.1 |
| 2003/0147299 A1* | 8/2003 | Setogawa | G11C 7/106 365/189.05 |
| 2003/0179619 A1* | 9/2003 | La | G11C 7/1066 365/200 |
| 2004/0114423 A1* | 6/2004 | La | G11C 7/1006 365/154 |
| 2008/0056018 A1* | 3/2008 | Kim | G11C 7/1006 365/189.05 |

* cited by examiner

*Primary Examiner* — J. H. Hur
(74) *Attorney, Agent, or Firm* — Dorsey & Whitney LLP

(57) ABSTRACT

A write-in date circuit in a semiconductor device may include multiple input buffers, each receiving multiple data bits in a serial data stream. The circuit may include a first circuit coupled to a first and a second input buffers. The first circuit may be further coupled to receive a DQS signal and latch a first data bit selected from the first input buffer or the second input buffer responsive to the DQS signal. The second circuit may be coupled to the first and second input buffers and configured to latch a second data bit selected from the first input buffer or the second input buffer responsive to the DQS signal. The first circuit may latch the first data bit responsive to a rising edge of the DQS signal and the second circuit may latch the second data bit responsive to a falling edge of the DQS signal.

16 Claims, 15 Drawing Sheets

APPARATUSES AND METHODS FOR LATCHING DATA INPUT BITS

BACKGROUND

In writing data in a semiconductor device, e.g., a memory, input data bits are usually received in series from a memory controller, converted to parallel data bits and then stored in the device. This may require latching of multiple data bits that are input in series. For example, data with a 16-bit burst length in a single DQ may be latched four bits at a time, each latch provides four output bits in parallel. In order to latch four bits that come in series, the data input circuit may include one or more delay circuits to delay one or more data bits so that all of the four bits are aligned and ready to be latched at the same time. These added delay circuits, along with other circuits that may be required to convert serial data bits to parallel bits may result in complexity of circuits in the semiconductor device and increase the power consumption of the device.

BRIEF DESCRIPTION OF THE DRAWINGS

The present solution will be described with reference to the following figures, in which like numerals represent like items throughout the figures.

DETAILED DESCRIPTION

Figure 1:
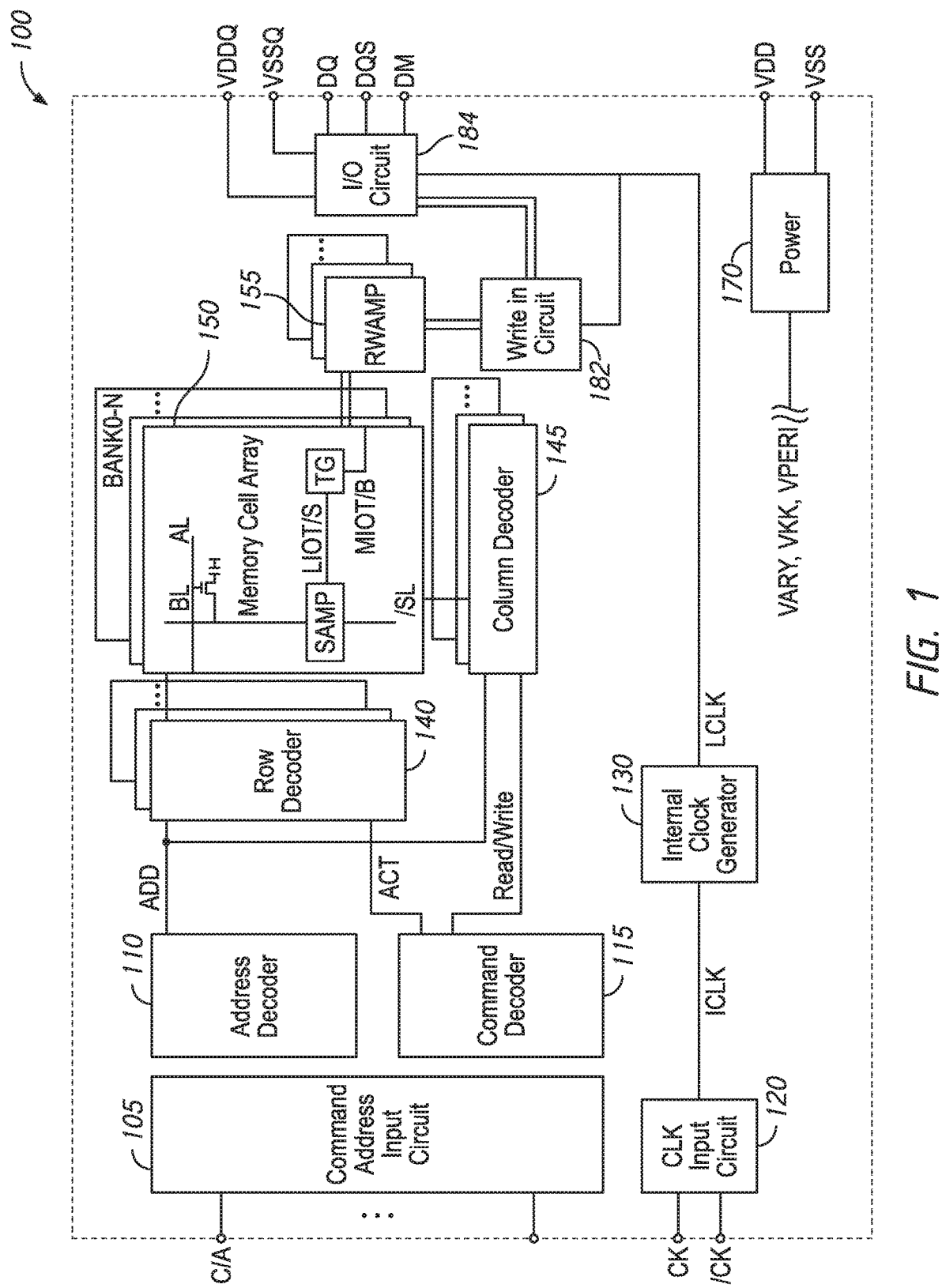
FIG. 1 illustrates a schematic block diagram of an example system for writing data in a semiconductor device in accordance with some examples disclosed herein.

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

In some scenarios, a semiconductor device 100 may include a memory die. The memory die may include a command/address input circuit 105, an address decoder 110, a command decoder 115, a clock input circuit 120, internal clock generator 130, row decoder 140, column decoder 145, memory arrays 150, read/write amplifiers 155, I/O circuit 184, and power circuit 170.

In some examples, semiconductor device 100 may include, without limitation, a dynamic random-access memory (DRAM) device, such as double data rate (DDR) DDR4, DDR5, low power DDR (LPDDR), integrated into a single semiconductor chip, for example. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SA) are located for their corresponding bit lines BL and connected to at least one respective local I/O line (LIOT/B), which is in turn coupled to a respective one of at least two main I/O line pairs (MIOT/B), via transfer gates (TG), which function as switches.

When an access operation is performed, the sense amplifiers sense a voltage difference between a BL to which an accessed memory cell (and the sense amplifier) is coupled and a reference voltage, and amplify the difference. The sense amplifiers may use the other BL to which the sense amplifier is coupled to provide the reference voltage. In some scenarios, the sense amplifiers adjacent to a border of the memory array 150 may be coupled to a one bit line BL segment and to a load segment rather than being coupled to (e.g., between) two bit line BL segments. The load segment may be used as a reference segment to provide the reference voltage when reading the one bit line segment. In some examples, the load segments may include circuitry configured to approximate the capacitance of a bit line BL segment. For example, the load segments may include capacitors or other circuitry that adds a capacitance load to the load segment. In some examples, the load segment may include tunable circuitry that is configured to adjust the capacitance of the load segment. During an initial setup or during an initialization process, the tunable circuitry may selectively activate or connect load circuitry by selectively providing a reference voltage to the load circuitry or selectively adjusting the reference voltage in order to adjust a capacitance of the load segment. In some examples, the load circuitry may include metal-oxide semiconductor field-effect transistors (MOSFETs) that are operated in a diode configuration.

Semiconductor device 100 may employ one or more external terminals that include address and command terminals coupled to command/address bus (C/A), clock terminals CK and/CK, data terminals DQ, DQS, and DM, power supply terminals VDD, VSS, VDDQ, and VSSQ.

The command/address terminals may be supplied with an address signal and a bank address signal from outside. The address signal and the bank address signal supplied to the address terminals are transferred, via the command/address input circuit 105, to an address decoder 110. The address decoder 110 may receive the address signal and decode the address signal to provide address signal ADD. The ADD signal may include a decoded row address signal and a decoded column address signal. The decoded row address signal is provided to the row decoder 140, and a decoded column address signal is be provided to the column decoder 145. The address decoder 110 may also receive the bank address signal and supply the bank address signal to the row decoder 140, the column decoder 145.

The command/address terminals may further be supplied with a command signal from outside, such as, for example, a memory controller. The command signal may be provided, via the C/A bus, to the command decoder 115 via the command/address input circuit 105. The command decoder 115 decodes the command signal to generate various internal commands that include a row command signal ACT to select a word line and a column command signal Read/Write, such as a read command or a write command, to select a bit line.

Accordingly, when a read command is issued and a row address and a column address are timely supplied with the read command, read data is read from a memory cell in the memory array 150 designated by these row address and column address. The read data DQ is output to outside from the data terminals DQ (data) and DQS (data strobe) via read/write amplifiers 155 and an input/output (IO) circuit 184. Similarly, when the write command is issued and a row address and a column address are timely supplied with this command, and then write data is supplied to the data terminals DQ, DQS, DM, the write data is received by data receivers in the input/output circuit 184, and supplied via the I/O circuit 184 and the read/write amplifiers 155 to the memory array 150 and written in the memory cell designated by the row address and the column address.

Turning to the external terminals included in the semiconductor device 100, the clock terminals CK and/CK may be supplied with an external clock signal and a complementary external clock signal, respectively. The external clock signals (including complementary external clock signal) may be supplied to a clock input circuit 120. The clock input circuit 120 may receive the external clock signals to generate an internal clock signal ICLK. The internal clock signal ICLK may be supplied to an internal clock generator 130 and thus a phase controlled internal clock signal LCLK is generated based on the received internal clock signal ICLK. In some non-limiting examples, a delay-locked loop (DLL) circuit, a duty cycle correction (DCC) circuit, or a combination thereof may be used as the internal clock generator 130. The phase controlled internal clock signal LCLK may be supplied to the input/output circuit 184 and used as a timing signal for determining an output timing of read data.

The power supply terminals are supplied with power supply potentials VDD and VSS. These power supply potentials VDD and VSS are supplied to an internal voltage generator circuit 170. The internal voltage generator circuit 170 may generate various internal potentials VARY, VKK, VPERI, and the like based on the power supply potentials VDD and VSS. The internal potential VARY may be used in the sense amplifiers included in the memory array 150, the internal potential VKK may be used in the row decoder 140, and the internal potential VPERI may be used in many other circuit blocks.

The power supply terminals may also be supplied with power supply potentials VDDQ and VSSQ. These power supply potentials VDDQ and VSSQ are supplied to the I/O circuit 184. The power supply potentials VDDQ and VSSQ are typically the same potentials as the power supply potentials VDD and VSS, respectively. However, the dedicated power supply potentials VDDQ and VSSQ are used for the I/O circuit 184 so that power supply noise generated by the I/O circuit 184 does not propagate to the other circuit blocks.

With further reference to FIG. 1, I/O circuit 184 may also include a data input circuit configured to provide write data to the read/write amplifiers 155 responsive to receiving DQ, DQS or DM signals via the I/O circuit 184.

In some examples, the I/O circuit 184 may receive data streams from DQ terminals in a serial manner responsive to receiving of DQS signal. Data input circuit of the I/O circuit 184 may provide write data by parallelizing the received serial data stream from the I/O circuit 184 and feed the write data bits in parallel to the memory cell array 150 via read/write amplifier 155. In some examples, the data input circuit may further receive additional clock signals for generating the write data responsive to the DQS. For example, when the semiconductor device 100 is powered up, data input circuit may perform an initialization process to determine the proper order of data bits to be supplied to the die. In some scenarios, data input circuit may receive an even and/or odd DQS signal, which indicates whether the first data in an input buffer is the true first bit in the write data. For example, an even DQS signal may indicate that the first data in the input buffer contains truly the first bit in the write data. An odd DQS signal, on the other hand, may indicate that the first data in the input buffer contains truly the second bit in the write data. The data input circuit is further illustrated by examples herein with reference to FIGS. 2-11.

Figure 2:
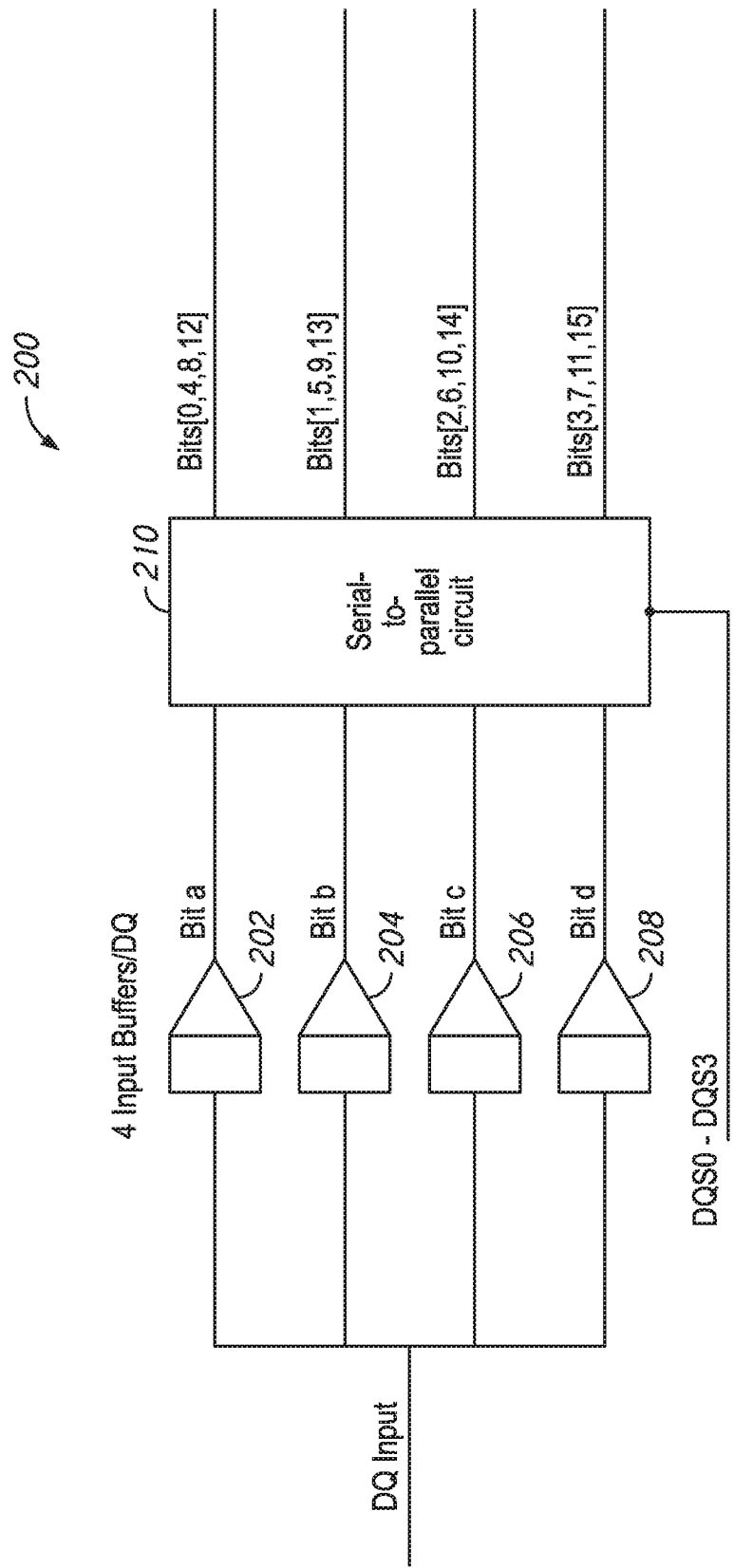
FIG. 2 illustrates a schematic block diagram of a data input circuit for parallelizing serial data in accordance with some examples disclosed herein.

FIG. 2 illustrates a schematic block diagram of a portion of an example data input circuit for parallelizing serial data in accordance with some examples disclosed herein. In some scenarios, the data input circuit of the I/O circuit, e.g., 184 in FIG. 1, may include a first sub-data input circuit 200. The first sub-data input circuit 200 may include a serial-to-parallel circuit 210 which may be coupled to one or more input buffers, e.g., 202-208. In some examples, the input buffers 202-208 may be part of the data input circuit 200. Alternatively, and/or additionally, the I/O circuit 184 in FIG. 1 may also include input buffers for receiving input data from DQ signals and providing input data to the data input circuit 200. The serial-to-parallel circuit 210 may be configured to latch a plurality of data bits received by the one or more input buffers, e.g., 202-208, responsive to one or more DQS signals, e.g., DQS0-DQS3. In some examples, input buffers 202-208 (e.g., in circuit 200 or in I/O circuit 184 in FIG. 1) may be configured to receive a first portion of a burst in a DQ and provide output bits, for example, Bit a, Bit b, Bit c and Bit d at each input buffer, respectively. For example, bit 0-bit 3 may arrive in a serial manner at input buffer 202, 204, 206 and 208, respectively. Responsive to a first DQS signal, e.g., DQS0, the serial-to-parallel circuit 210 may latch output bits from the input buffers, e.g. bit 0-bit 3 together, to produce output data bits bit 0-bit 3 in parallel.

In some examples, the data input circuit (e.g., in 184 in FIG. 1) may duplicate circuit 200 in a suitable number to be able to latch whole data bits in a burst in parallel. For example, a data input circuit may include a second sub-data input circuit (similar to the first sub-data input circuit 200 but not shown), which may include a second serial-to-parallel circuit (similar to the first serial-to-parallel circuit 210). The second serial-to-parallel circuit may be configured to receive a second portion of the burst in the DQ stream, for example, the second four data bits, bits 4-7. Responsive to a second DQS signal, e.g., DQS1, the second serial-to-parallel circuit (not shown, but similar to the first serial-to-parallel circuit 210) may latch bit 4-bit 7 together, to produce output data bits bit 4-bit 7 in parallel.

In some examples, the data input circuit (e.g., in 184 in FIG. 1) may include additional sub-data input circuits similar to the first sub-data input circuit 200, depending on the burst length in a DQ. For example, a burst length may be 16-bits. The data input circuit may include a third sub-data input circuit configured to receive a third portion of the burst in the DQ stream, e.g., bits 8-11, which may be latched by a serial-to-parallel circuit in parallel and output as bit 8-bit 11. The data input circuit may also include a fourth sub-data input circuit configured to receive a third portion of the burst in the DQ stream, e.g., bits 12-15, which may be latched by a serial-to-parallel circuit in parallel and output as bit 12-bit 15. It is appreciated that variations as to the number of bits in each portion of the burst may be possible. Correspondingly, the number of sub-data input circuits and the number of data bits received in each sub-data input circuit may also vary. The one or more parallel latched data bits described herein are further supplied to the read/write amplifiers of the semiconductor device (e.g., 155 in FIG. 1), which supplies the parallel data to the die. The operations of the data input circuit in FIG. 1 and FIG. 2 are now further explained with example timing diagrams in FIG. 3.

Figure 3:
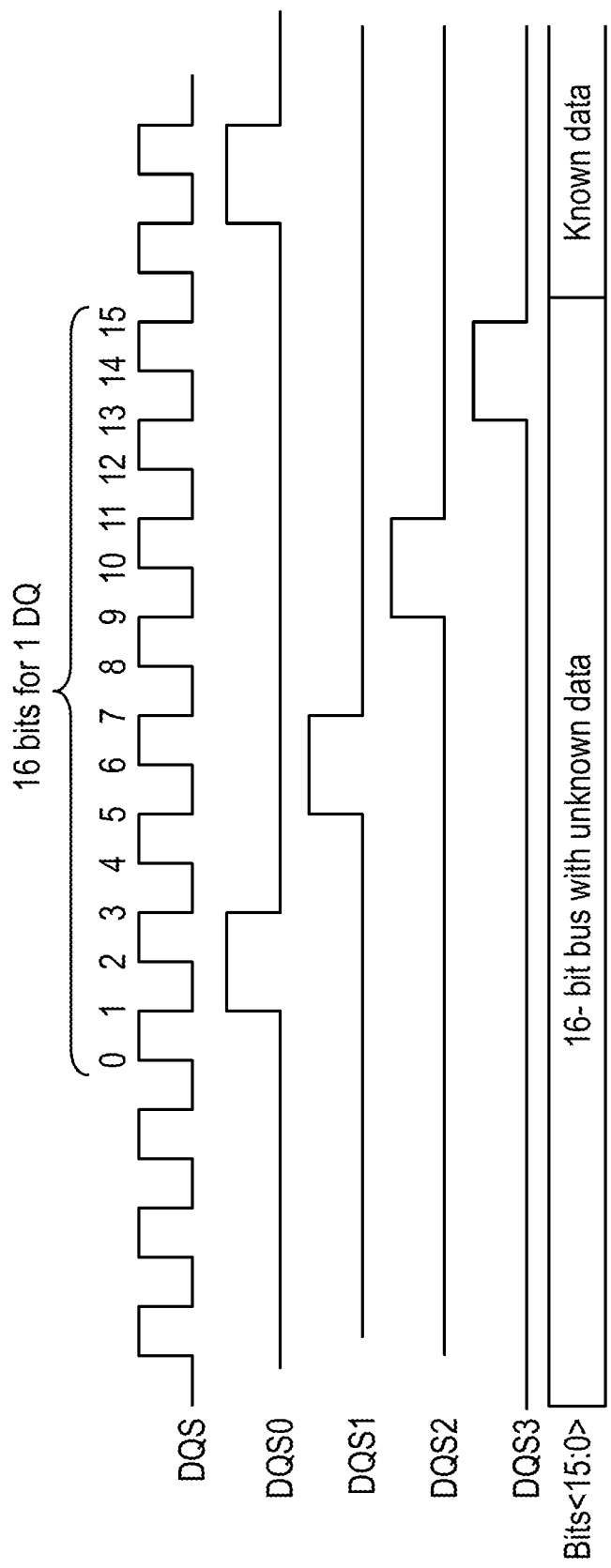
FIG. 3 illustrates a timing diagram for an example data input circuit for parallelizing serial data in accordance with some examples disclosed herein.

FIG. 3 illustrates a timing diagram of an example data input circuit for parallelizing serial data in accordance with some examples disclosed herein. In some examples, data bits, e.g., bits 0, 1, 2, etc. in a data burst in one DQ, may be received at data input circuit (e.g., in 184 in FIG. 1), where each data bit in the data burst may be received in series responsive to a clock signal tCK. In a non-limiting example, in a fast memory device, such as DDR4 and DDR5, data bits may be received at every single edge (e.g., rising and falling edge) of the clock tCK, e.g., at every half cycle of the tCK. In FIG. 3, for example, a burst in a DQ signal may have a length of 16-bits, in which data are received at data input circuit responsive to each of the rising and falling edge of the tCK signal DQS.

With reference to FIGS. 2 and 3, in some examples, every two data bits are latched together. For example, data bits 0 and 1 may be latched together, and bits 2 and 3 may be latched together, so on and so forth. In some examples, a single rising edge and a subsequent falling edge of a DQS signal may be used to respectively latch multiple data bits. For example, a rising edge in a first DQS signal, e.g., DQS0 may be used to latch bits 0 and 1, whereas a falling edge in the same DQS0 signal may be used to latch bits 2 and 3. In the instant example, each DQS signal, e.g., DQS0, may have a pulse having a width equal to a tCK cycle. When the rising edge of DQS0 has arrived, both bit 0 and bit 1 from the input buffers may be available, and DQS0 may subsequently latch bit 0 and bit 1. When the falling edge of DQS0 has arrived, both bits 2 and 3 from the input buffers may become available, and DQS0 may subsequently latch bits 2 and 3.

In a similar manner, a second DQS signal, e.g., DQS1, may also have a pulse with a width equal to the tCK cycle. DQS1 may be delayed from DQS0 by one tCK clock cycle. The rising edge of DQS1 may be used to latch bits 4 and 5, and the falling edge of DQS1 may be used to latch bits 6 and 7. A third DQS signal, e.g., DQS2, may also have a pulse with a width equal to the clock cycle of the tCK. DQS2 may be delayed from DQS1 by one tCK clock cycle. The rising edge of DQS2 may be used to latch bits 8 and 9, and the falling edge of DQS2 may be used to latch bits 10 and 11. A fourth DQS signal, e.g., DQS3, may also have a pulse with a width equal to the clock cycle of the tCK. DQS3 may be delayed from DQS2 by one tCK clock cycle. The rising edge of DQS3 may be used to latch bits 12 and 13, and the falling edge of DQS3 may be used to latch bits 14 and 15. After the falling edge of DQS3 has arrived, all of the 16 bits in the DQ burst will be latched, and the write data will be known.

It is appreciated that although both rising edge and falling edge in the same DQS signal are used to each latch two consecutive bits together, e.g., bits 0 and 1, and bits 2 and 3, two different DQS signals may also be used to latch the data bits in a similar manner as using the rising edge and falling edge of the same DQS signal. For example, in FIG. 4B, an inverted DQS signal DQSF may be a complementary signal to DQS. In such case, both the rising edge of DQS and the rising edge of DQSF (with the same timing as the falling edge of DQS) may be used to latch bits 0 and 1, and bits 2 and 3, respectively, effectively giving the same effect of using the rising edge and falling edge of a single DQS signal.

Figure 4A:
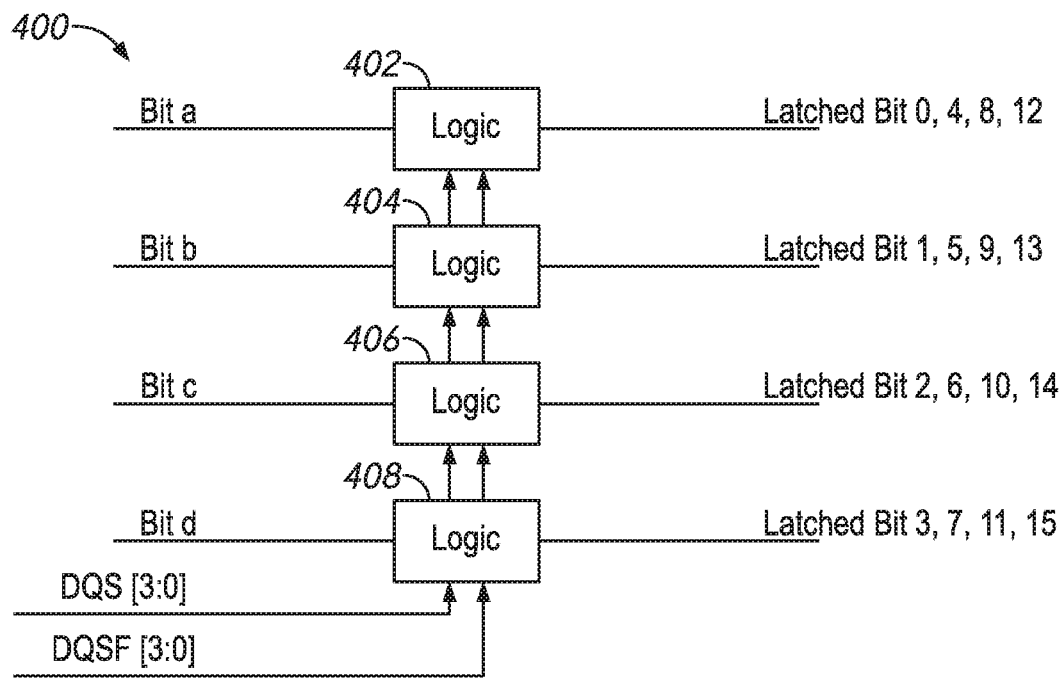
FIG. 4A illustrates a schematic block diagram of a portion of a data input circuit for latching multiple bits in a data burst in accordance with some examples disclosed herein.

FIG. 4A illustrates a schematic block diagram of a sub-data input circuit for latching multiple bits in a data burst in accordance with some examples disclosed herein. Circuit 400 may be an example implementation of the data input circuit in 184 in FIG. 1 or sub-data input circuit 200 in FIG. 2. In some scenarios, circuit 400 may include one or more logic circuits 402-408, each coupled to an output of a respective input buffer (e.g., input buffers 202-208 in FIG. 2) and configured to receive a data bit, Bit a, Bit b, Bit c and Bit d from each respective input buffer. Each of logic circuits 402-408 may be configured to latch the respective data bit coupled thereto. For example, logic circuit 402 may be configured to latch data bit 0 from Bit a in the DQ stream responsive to a first DQS signal, e.g., DQS0. Logic circuits 404, 406 and 408 may also be configured to each latch bit 1, bit 2, and bit 3, respectively, responsive to the first DQS signal. Logic circuits 402, 404, 406 and 408 may also be configured to each latch bit 4, bit 5, bit 6 and bit 7 from output of input buffers Bit a, Bit b, Bit c and Bit d, respectively, responsive to a second DQS signal. Logic circuits 402, 404, 406 and 408 may also be configured to each latch bit 8, bit 9, bit 10 and bit 11 from output of input buffers Bit a, Bit b, Bit c and Bit d, respectively, responsive to a third DQS signal. Logic circuits 402, 404, 406 and 408 may also be configured to each latch bit 12, bit 13, bit 14 and bit 15 from output of input buffers Bit a, Bit b, Bit c and Bit d, respectively, responsive to a fourth DQS signal. The latching of data bits in circuit 400 may further be explained with respect to FIG. 4B.

Figure 4B:
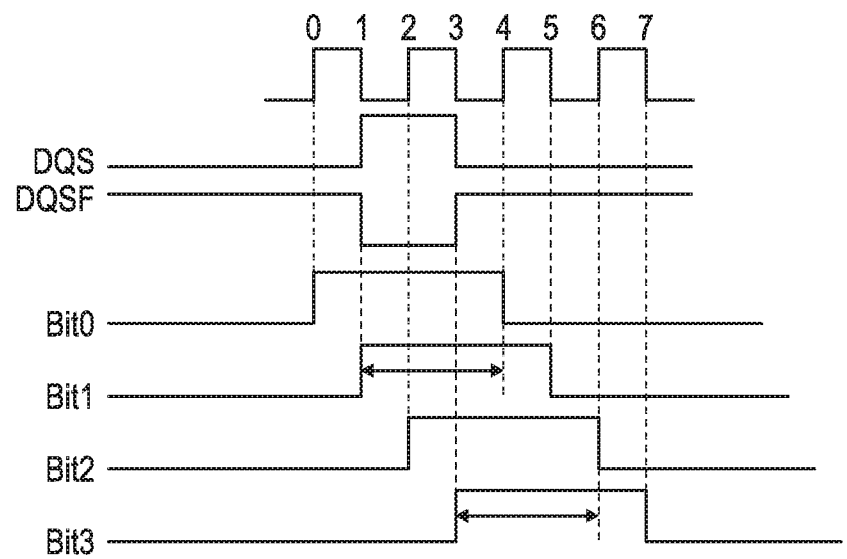
FIG. 4B illustrates a timing diagram for example circuits for latching multiple bits in a data burst in accordance with some examples disclosed herein.

FIG. 4B illustrates a timing diagram of latching multiple bits in a data burst in accordance with some examples disclosed herein. In some examples, when data bits of a DQ stream, for example, bit 0 and bit 1 arrive with a timing difference of a half tCK cycle (for example, in a DDR4 or DDR5 semiconductor device) and are fed to a respective input buffer, each data bit in the input buffer (e.g., 202-208 in FIG. 2) may be propagated (or extended) so that each data bit may stay available for a period of 2 tCK cycles. This will allow two consecutive data bits, e.g., bits 0 and 1, to have a wider holding window, in which the two data bits will be aligned and latched together.

In some examples, the data input circuit (e.g., in 184 in FIG. 1) may receive a DQS signal, e.g., DQS, such that logic circuit 402 and logic circuit 404 may latch bit 0 and bit 1, respectively, responsive to a rising edge of the DQS, when both bit 0 and bit 1 are simultaneously available. Similarly, logic circuits 406 and 408 may be configured to latch data bits 2 and 3, respectively, responsive to a falling edge of the DQS, when both bits 2 and 3 are available. In some scenarios, the signal DQS may include a pulse having a width. As shown in FIG. 4B, the width of DQS may be of at least one tCK cycle such that, when bits 0-4 are each sequentially delayed from a preceding bit by half of a tCK cycle, bits 0 and 1 can be latched by a rising edge of the DQS signal while bits 2 and 3 can be latched by a falling edge of the DQS signal.

Alternatively, and/or additionally, the falling edge of the DQS signal may correspond to a rising edge of an inverted signal DQSF. In some scenarios, both DQS and complementary signal DQSF may be coupled to logic circuits 402-408, so that, logic circuits 402-408 may each be configured to latch at a rising edge of a clock signal, either from DQS or from DQSF, giving an effect of latching data bits at both a rising edge and a falling edge of the same signal DQS. In the instant example, logic circuits 406, 408 may be coupled to DQSF, and may latch bits 2 and 3, respectively, responsive to a rising edge of DQSF.

Returning to FIG. 4A, a first DQS signal, e.g., DQS[0], or a complementary pair including DQS[0] and DQSF[0], may be used to cause each of the logic circuits 402-408 to respectively latch bits 0, 1, 2 and 3. The data input circuit may include one or more of circuit 400 to latch various data bits in a burst. For example, a second DQS signal, e.g., DQS1, or a complementary pair including DQS1 and DQSF1, may be used to cause each of the logic circuits 402-408 to respectively latch bits 4, 5, 6 and 7. Similarly, a third DQS signal, e.g., DQS2, or a complementary pair including DQS2 and DQSF2, may be used to cause each of the logic circuits 402-408 to respectively latch bits 8, 9, 10 and 11. A fourth DQS signal, e.g., DQS3, or a complementary pair including DQS3 and DQSF3, may be used to cause each of the logic circuits 402-408 to respectively latch bits 12, 13, 14 and 15.

The disclosures described herein may provide advantages over existing latching apparatuses and methods in a semiconductor device in that two consecutive data bits in a DQ stream may be latched together responsive to a rising edge of a DQS signal, followed by two other consecutive data bits in the DQ stream being latched together responsive to a falling edge of the same DQS signal (or rising edge of the complementary DQS signal). Latching two bits at a time using a single DQS signal or two complementary DQS signals may result in simpler circuitry as opposed to latching four bits using a single edge of a clock in existing devices. This may also result in a lower power consumption in the semiconductor device. These advantages will be further illustrated by examples with respect to FIGS. 5-11.

Figure 5A:
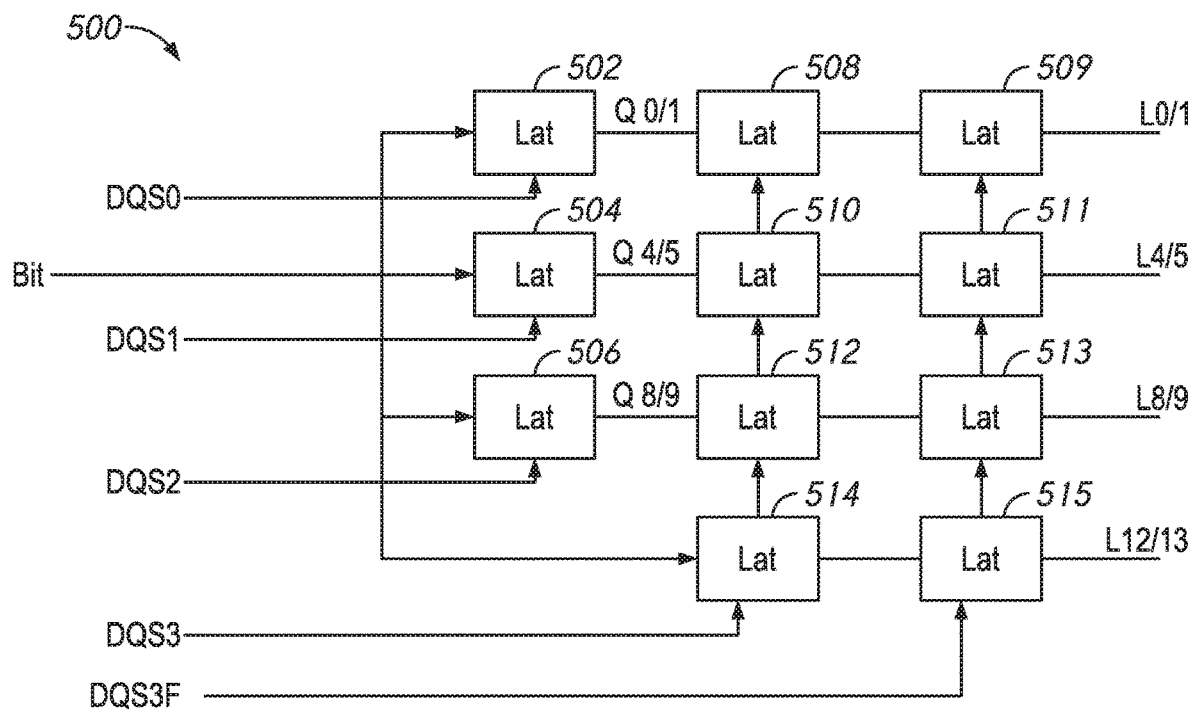
FIG. 5A illustrates schematic block diagrams of circuits for latching various bits in a data burst in accordance with some examples disclosed herein.

FIG. 5A illustrates schematic block diagrams of examples of latching circuits for latching various bits in a data burst in accordance with some examples disclosed herein. In some examples, circuits 500 and 501 may each include a plurality of latch circuits, e.g., 502-515, 522-534 configured to latch various data bits in a data burst. Circuit 500 may be configured to latch certain bits responsive to rising edges of multiple DQS signals, whereas circuit 501 may be configured to latch certain bits responsive to falling edges of multiple DQS signals (or rising edge of multiple complementary DQS signals). In a non-limiting example, circuit 500 may include a first set of latch circuits 502, 504, 506, which are coupled to a common data line that receives the output of an input buffer, e.g., one of input buffers 202, 204, 206 and 208 in FIG. 2. Each latch circuit 502-506 may also be coupled to a first DQS signal DQS0, a second DQS signal DQS1 and a third DQS signal DQS2, respectively.

In some examples, the first set of latches 502-506 may also be configured to propagate the data bits on the common data line. For example, the common data line is coupled to the output of the first input buffer, which may contain data Bit a, which may be bit 0, 4, 8 and 12 in the data stream. These data bits from the first input buffer may arrive in series, at every 2 tCK cycles, e.g., bits 0 and 4 shown in FIG. 5B. Responsive to each respective clock signals DQS, e.g., DQS0, DQS1, DQS2, these data bits from the common data line may be latched at output of each respective latch, e.g., Q0/Q1, Q4/Q5 and Q8/Q9. Circuit 500 may also include a second set of latches, e.g., 508, 510, 512, the input of which is respectively coupled to the output of a corresponding latch in the first set of latches, e.g., Q0/Q1, Q4/Q5, Q8/Q9. Additionally, the second set of latches may also include an additional latch, e.g., 514 directly coupled to the bit line. The second set of latches, e.g., 508, 510, 512, 514 may be configured to latch data at each respective input responsive to a fourth DQS signal DQS3. In some examples, the second set of latches 508, 510, 512, 514 may latch data responsive to a rising edge of DQS3. When the rising edge of DQS3 arrives, data bit 12/13 will become available, and may subsequently be latched to the output of latch circuit 514, e.g., L12/L13. Responding to the same clock signal DQS3, latches 508, 510, 512 may also propagate data stored at each corresponding latch in the first set of latches 502-506 and latch these data bits at the output of each respective latch, e.g., at latched data lines L0/L1, L4/L5, L8/L9. Consequently, when the rising edge of the fourth DQS signal, e.g., DQS3 has arrived, all of the data bits at latched data lines L0/L, L4/L5, L8/L9 and L12/L13 may be simultaneously latched in parallel at latches 508, 510, 512, 514. In some examples, the latched data lines L0/L1, L4/L5, L8/L9 and L12/L13 are coupled to the read/write amplifiers (e.g., 155 in FIG. 1) and the latched data bits at the latched data lines are sent to memory array. Additionally, and/or alternatively, circuit 500 may include a third set of latches, e.g., 509, 511, 513, 515 that may each be coupled respectively to the output of latches 508, 510, 512 and 514 to latch data therefrom responsive to a rising edge of an inverted signal of DQS3, e.g., DQS3F.

Figure 5A:
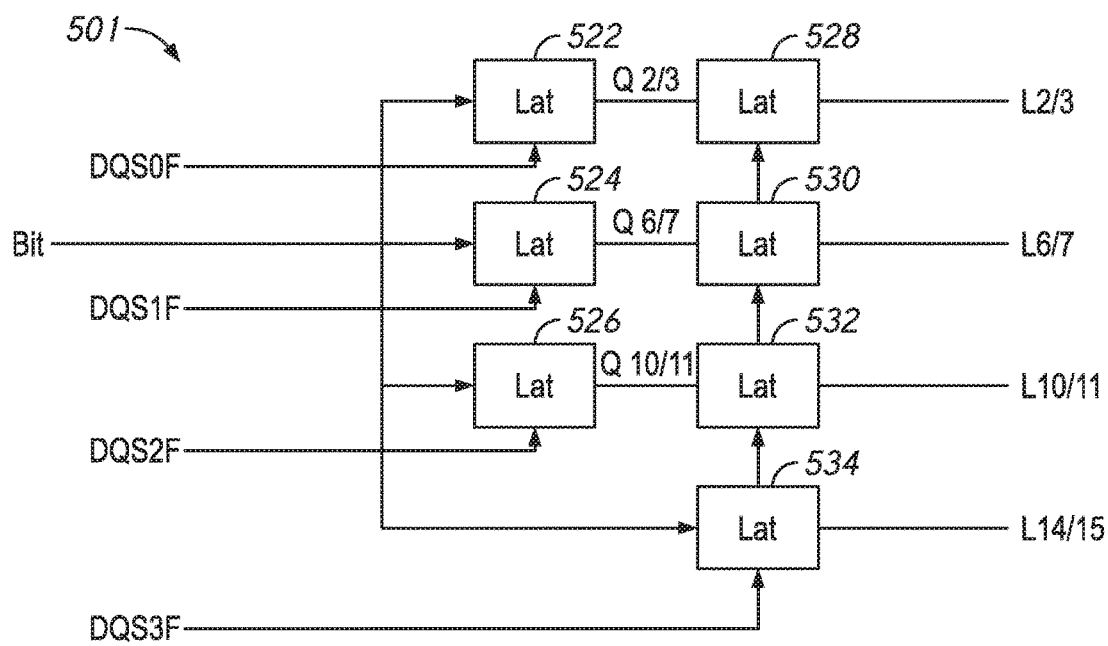
Figure 5B:
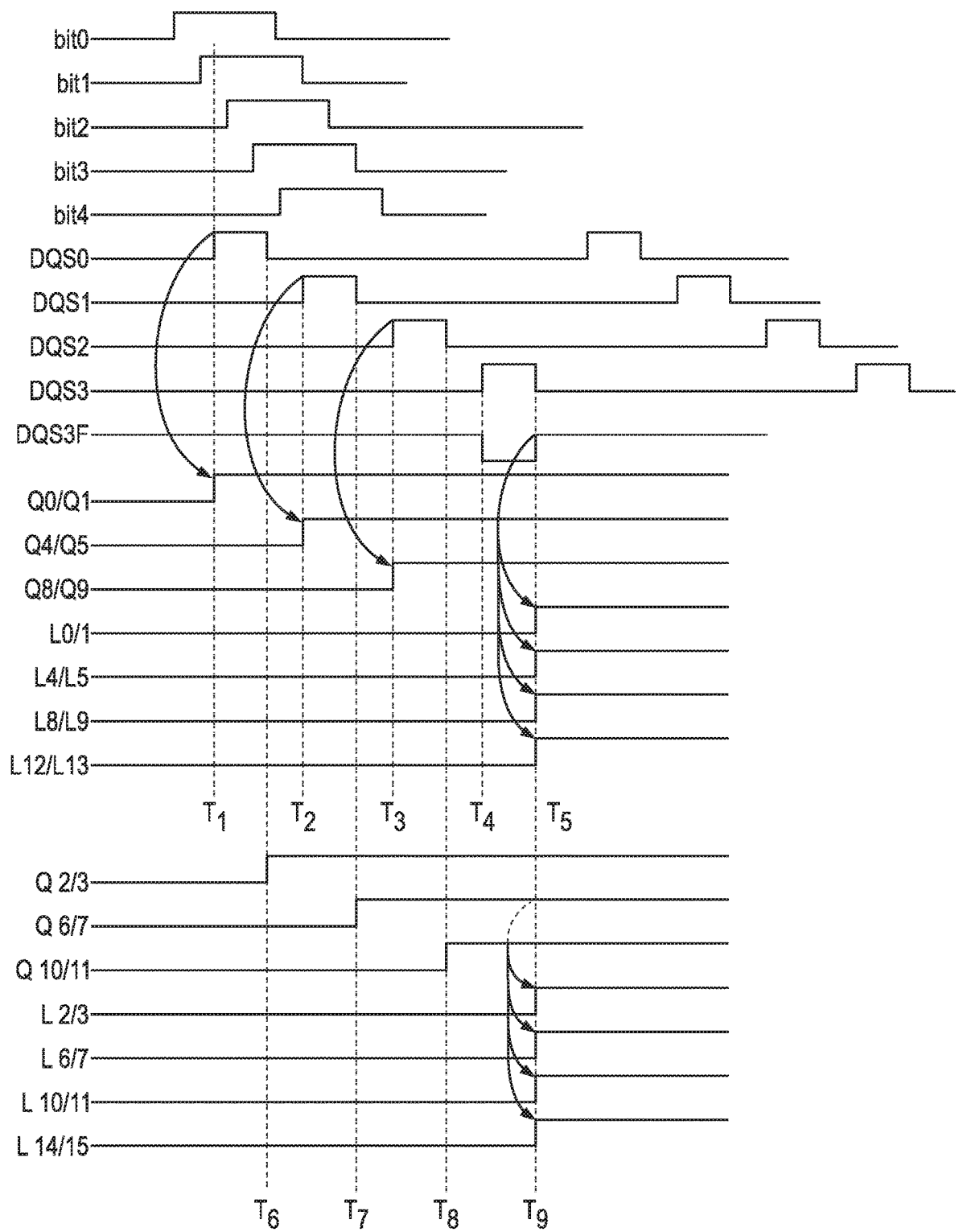
FIG. 5B illustrates a timing diagram for latching multiple bits in a data burst in accordance with some examples disclosed herein.

FIG. 5B illustrates a timing diagram of a logic circuit for converting serial data bits in DQ streams to parallel data bits. The logic circuit may be implemented, for example, in circuit 500, 501 in FIG. 5A, in circuit 400 in FIG. 4A, in circuit 200 in FIG. 2 or data input circuit in 184 in FIG. 1. As described in FIG. 3, each received data bit, e.g., bit 0, bit 1, ... bit 15, may be delayed from its preceding data bit by a half tCK cycle, for example, in a double rate semiconductor device. In other words, succeeding data bits in the DQ burst may have a delay. For example, each data bit in the DQ burst arrives at every half tCK cycle sequentially. Each data bit 0, 1, 2, ..., 15 in a DQ burst may be received at circuit 500 (in FIG. 5A) from one or more input buffers, such as those shown in 202-208 in FIG. 2. As described in FIG. 4B, each data bit at the output of input buffer may be extended to have a two tCK cycle holding window, which allows multiple data bits, e.g., two bits to be latched together. For example, in FIG. 5B, bit 0-bit 3 each has a width of two tCK cycles, where bit 1 is delayed by half tCK from bit 0, bit 2 is delayed by half tCK from bit 1, and bit 3 is delayed by half tCK from bit 2.

With further reference to FIGS. 5A and 5B, the rising edge of a first DQS signal, e.g., DQS0, at time T1 causes latch circuit 502 to latch data bits 0 and 1 and store the data bits at output Q0/Q1. Similarly, the rising edge of a second DQS signal, e.g., DQS1, at time T2 causes latch circuit 504 to latch data bits 4 and 5 and store the data at output Q4/Q5. The rising edge of a third DQS signal, e.g., DQS2, at time T3 causes latch circuit 506 to latch data bits 8 and 9 and store the data at output Q8/Q9. At the arrival of the rising edge of a fourth DQS signal, e.g., DQS3, at time T4, all of the stored data will become available at the outputs of latch circuits 502-506, e.g., Q0/Q1, Q4/Q5 and Q8/Q9. Further, the rising edge of DQS3 will cause the second set of latches 508, 510, 512 and 514 to propagate all of the outputs Q0/Q1, Q4/Q5 and Q8/Q9 respectively at each latch circuit. Data bit 12/13 will further be latched at time T4 via latch circuit 514. At the falling edge of DQS3F, the propagated data bits from latches 508, 510, 512 and 514 are further latched by latches 509, 511, 513 and 515 at output L0/1, L4/5, L8/9 and L12/13. As such, data bits 0/1, 4/5, 8/9 and 12/13 will be latched together in parallel responsive to the falling edge of DQS3 (or the rising edge of DQS3F).

Similarly, circuit 501 may latch certain data bits in the DQ stream, e.g., bits 2/3, 6/7, 10/11 and 14/15 in parallel responsive to the falling edge of DQS3, or the rising edge of DQS3F. In the instant example in which the burst length in a DQ stream is 16 bits, data bits 2/3, 6/7, 10/11 and 14/15 may be latched to generate latched bits at latched data lines L2/3, L6/7, L10/11 and L14/15 in parallel. In some examples, the latched data lines L2/3, L6/7, L10/11 and L14/15 are coupled to the read/write amplifiers (e.g., 155 in FIG. 1) and the latched data bits at the latched data lines are sent to memory array. At the falling edge of DQS3, all of the data bits in the 16-bit DQ burst will be latched in parallel.

It is appreciated that circuit 500 may be duplicated to generate latched bits 0, 4, 8 and 12 or 1, 5, 9 and 13. Similarly, circuit 501 may be duplicated to generate latched bits 2, 6, 10 and 14 and 3, 7, 11 and 15. It is further appreciated that configurations of circuit 500 or circuit 501 may vary to accommodate various burst length in the DQ stream. In some examples, circuits 500 and 501 may have fewer or more latch circuits to generate fewer or more latched bits in parallel. For example, each of circuits 500 or 501 may be configured to latch 6 bits, 8 bits or any suitable number of bits in a similar manner. Further, the serial-to-parallel circuit (e.g., 210 in FIG. 2) may include more or fewer of each of circuit 500 or circuit 501 to latch more or fewer data bits in parallel. For example, the serial-to-parallel circuit may include four of circuit 500 and four of circuit 501 that can be configured to latch 32 bits in parallel. Other combinations and variations may also be possible.

Figure 6:
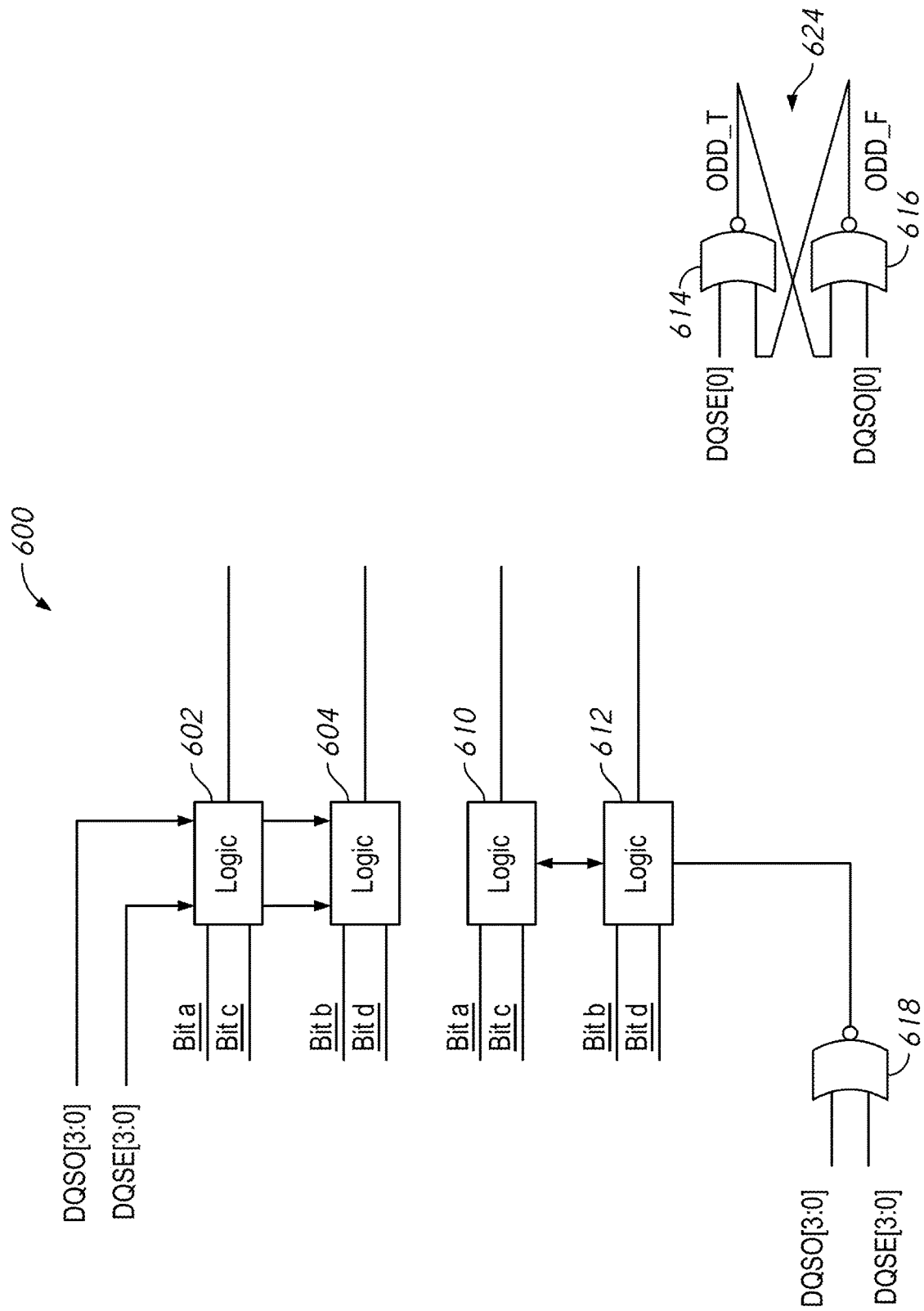
FIG. 6 illustrates a schematic block diagram of a portion of a data input circuit for latching multiple bits in a data burst in accordance with some examples disclosed herein.

FIG. 6 illustrates a schematic block diagrams of a portion of a writing-in circuit for latching multiple bits in a data burst in accordance with some examples disclosed herein. In a semiconductor device, such as 100 in FIG. 1, the proper order of data bits in the DQ data stream may not be known at power up and the order may change for each write command. For example, in a four-bit data stream, the first two bits received in series, e.g., from the first and second input buffers, represented as Bit a and Bit b, may be the true first and second bits in the data stream. The first two bits Bit a and Bit b received may alternatively correspond to bit 2 and bit 3 in the data stream. This bit ordering may be decided at each write command, depending on the relationship between the write command relative to DQS. For example, if a write command aligns with the DQS edge latching Bit a, then Bit a is first. If the write command aligns with DQS edge latching Bit c, then Bit c is first. In some examples, a serial-to-parallel circuit 600 may be configured to latch the parallel data bits in the correct order.

Figure 7A:
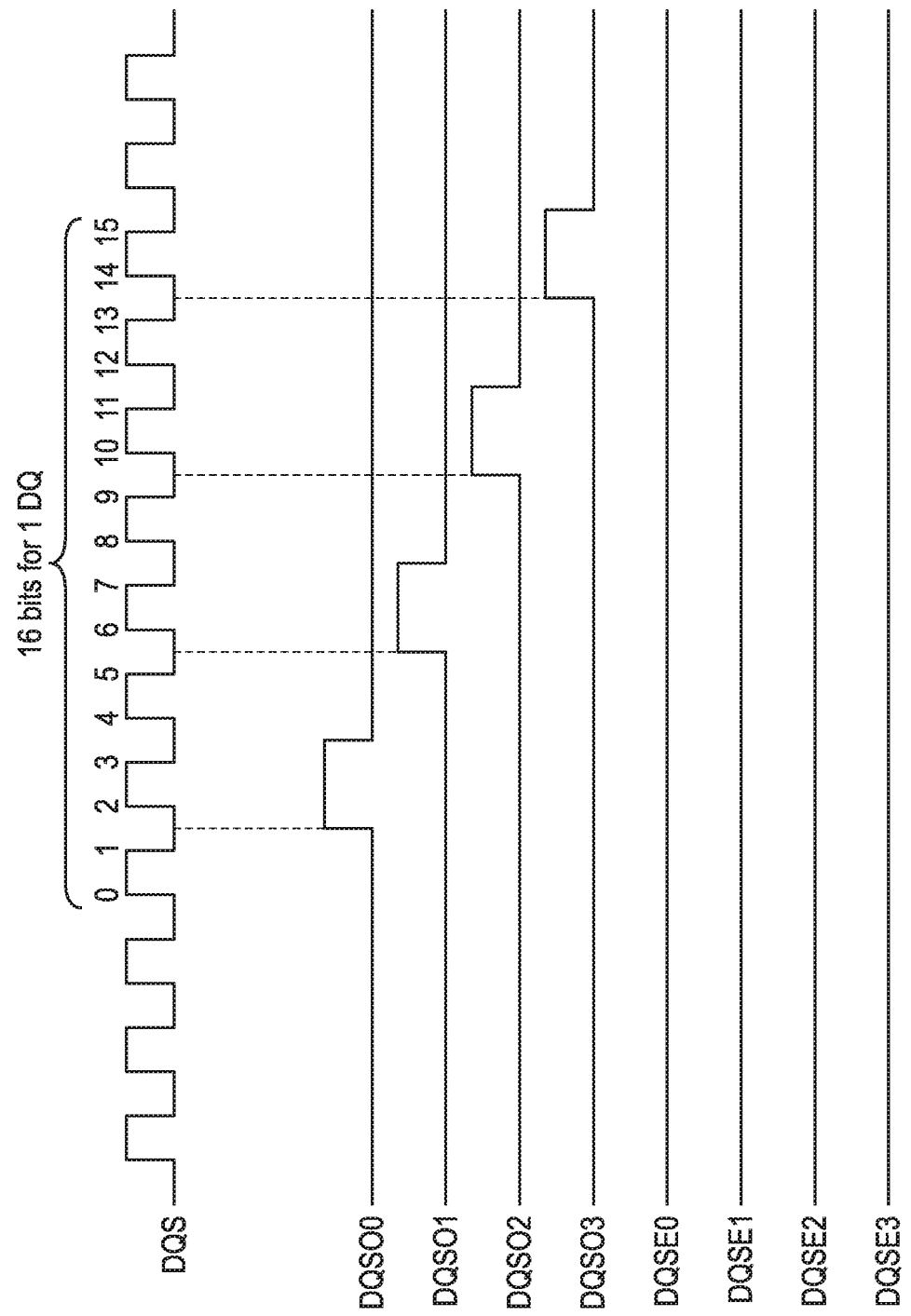
FIGS. 7A and 7B illustrate examples of odd data strobe signal (DQS) signals and even DQS signals in accordance with some examples disclosed herein.
Figure 7B:
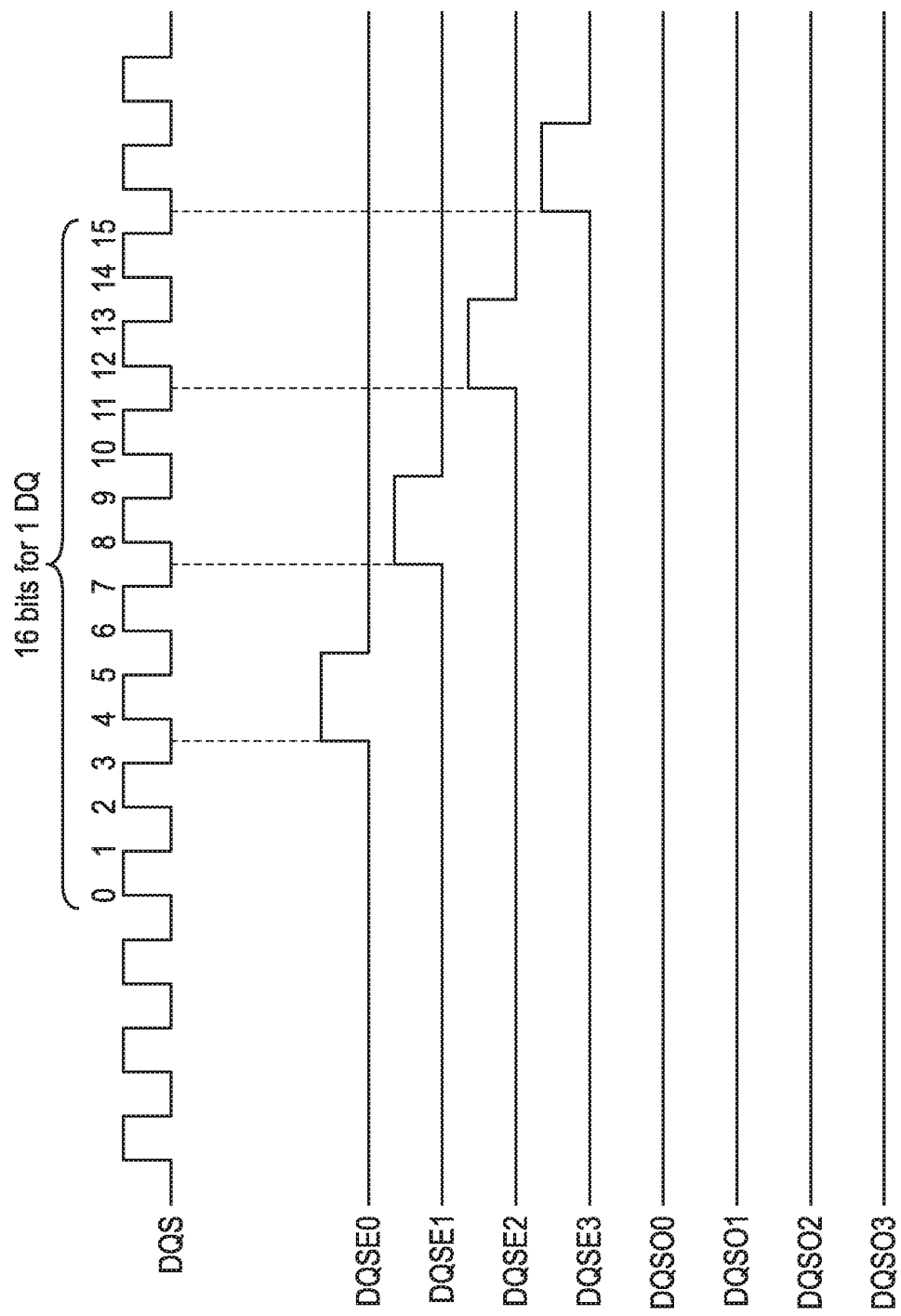

FIGS. 7A and 7B illustrate examples of odd DQS signals and even DQS signals in accordance with some examples disclosed herein. In some examples, DQS signals may include even or odd DQS signals. Each of the even or odd DQS signals may indicate whether the data in the first input buffer are the first data bits in the write data. For example, active odd DQS signals, such as shown in FIG. 7A, may indicate that the data in the first input buffer contain the true first bits, e.g., bits 0 and 1, in the write data. As such, a rising edge of a first odd DQS signal, e.g., DQSO0 is aligned with or delayed from the arrival of the second bit (e.g., bit 1) from the input buffer. In case the odd DQS signals are active, even DQS signals become inactivate, e.g., stay flat at a constant logic level, such as logic low. FIG. 7B shows active even DQS signals, which may indicate that the data in the first input buffer contain the true second bits, e.g., bits 2 and 3 in the write data. For example, a rising edge of a first even DQS signal, e.g., DQSE0 is aligned with or delayed from the arrival of the fourth bit (e.g., bit 3) from the input buffer. In case the even DQS signals are active, odd DQS signals become inactivate, e.g., stay flat at a constant logic level, such as logic low.

With further reference to FIG. 6, a serial-to-parallel circuit 600 may include a plurality of logic circuits 602-612, such as full logic circuits 602, 604, and half logic circuits 610, 612, the details of which will be further explained with reference to FIGS. 8-11. Each logic circuit 602-612 may be coupled to an output of a corresponding input buffer (e.g., 202-208 in FIG. 2). For example, logic circuit 602 may have two input terminals each coupled to respectively receive data bits from the first and third input buffers. Logic circuit 604 may have two input terminals each coupled to respectively receive data bits from the second and fourth input buffers. Logic circuit 610 may be coupled to the first and third input buffers. Logic circuit 612 may be coupled to the second and fourth input buffers. Each logic circuit 602, 604, 610, 612 may be implemented in accordance with disclosures with reference to FIGS. 8 and 10, for example. Additionally, each logic circuit 602-612 may operate responsive to an even/odd switching signal ODD_T.

In some examples, circuit 600 may include an even/odd switching circuit 624 that is configured to generate the even/odd switching signal ODD_T. For example, switching circuit 624 may include a set-reset (SR) latch. The SR latch may include a pair of NOR gates 614, 616 cross-coupled. The stored bit of the SR latch 624 is present on the output ODD. The inputs of the SR latch 624 may be coupled to the first even DQS signal, e.g., DQSE[0] and the first odd DQS signal, e.g., DQSO[0], respectively. When DQSE[0] is activated, the DQSO[0] may be deactivated, e.g., at a logic low. Before the rising edge of the DQSE[0] arrives, both inputs to the SR latch circuit 624 are at logic low, causing the SR latch to be at a holding state until the rising edge of the DQSE[0] arrives. ODD_T goes low (and ODD_F becomes high) when DQSE[0] fires high. ODD_T goes high (and ODD_F becomes low) when DQSO[0] fires high. This state stays unchanged until a subsequent write command arrives. The logic level of the ODD_T signal may be used by the logic circuits 602-612, as will be described in FIGS. 8 and 10.

When DQSO[0] is activated, DQSE[0] may be deactivated, e.g., at a logic low. Before the rising edge of the DQSO[0] arrives, both inputs to the SR latch circuit 624 are at logic low, causing the SR latch to be at a holding state until the rising edge of the DQSO[0] arrives. When the rising edge of the DQSO[0] arrives, the ODD_T signal becomes high and ODD_F become low. This state stays unchanged until a subsequent write command arrives. In some examples, half logic circuits 610, 612 may be configured to latch data bits responsive to a combination of odd DQS signals and even DQS signals. For example, a NOR logic gate 618 may be coupled to odd and even DQS signal lines at input and the output may be coupled to the clocks of logic circuits 610, 612. Since odd and even DQS signals are active one at a time, the output of NOR gate 618 corresponds to one of the odd or even DQS signals when the odd or even DQS signals are active.

Depending on whether an even DQS or an odd DQS is activated, the even/odd switch signal ODD_T provided by circuit 624 may cause logic circuit 602 to latch data bits from the first input buffer, e.g., Bit a, or the third input buffer, e.g., Bit c. If even DQS signals, e.g., DQSE[3:0] are activated, the odd DQS signals, e.g., DQSO[3:0] are deactivated, for example, having a logic low, logic circuit 602 may be configured to latch data bits from the first input buffer. As each of the activated DQSE[3:0] signals corresponds to one of a first, second, third and fourth DQS signal described herein, data bits 0, 4, 8, and 12 from the first input buffer will be latched by logic circuit 602 responsive to each of the DQSE[3:0] signals. Similarly, data bits 1, 5, 9 and 13 from the second input buffer may be latched by logic circuit 604.

If odd DQS signals, e.g., DQSO[3:0] are activated, the even DQS signals, e.g., DQSE[3:0] are deactivated, for example, having a logic low, logic circuit 602 may be operated to latch data bits from the third input buffer, e.g., Bit c. Each of the activated DQSO[3:0] signals corresponds to one of a first, second, third and fourth DQS signal described herein. In such case, data bits 2, 6, 10 and 14 from the third input buffer will be latched by logic circuit 602 as latched bits, e.g., L0, L4, L8 and L12, respectively, responsive to each of the DQSO[3:0] signals. Similarly, data bits 3, 7, 11 and 15 from the fourth input buffer may be latched by logic circuit 604.

In some examples, circuits 610 and 612 may be configured to latch remaining data bits in a burst responsive to the even/odd switching signal ODD_T. For example, when even DQS signals are activated, and odd DQS signals are deactivated, the even/odd switch signal ODD_T provided by circuit 624 may cause logic circuit 610 to latch data bits from the third input buffer, e.g., Bit c, and cause logic circuit 612 to latch data bits from the fourth input buffer, e.g., Bit d. As each of the activated DQSE[3:0] signals or DQSO[3:0] signals corresponds to one of a first, second, third and fourth DQS signal described herein, data bits 2, 6, 10, 14 from the third input buffer will be latched by logic circuit 610 and data bits 3, 7, 11 and 15 from the fourth input buffer will be latched by logic circuit 612.

If odd DQS signals, e.g., DQSO[3:0] are activated, the even DQS signals, e.g., DQSE[3:0] are deactivated, for example, having a logic low, logic circuit 610 may be operated to latch data bits from the first input buffer, e.g., Bit a, and logic circuit 612 may be operated to latch data bits from the second input buffer, e.g., Bit b. In such case, data bits 0, 4, 8 and 12 from the first input buffer will be latched by logic circuit 610, and data bits 1, 5, 9 and 13 from the second input buffer will be latched by logic circuit 612.

Figure 8:
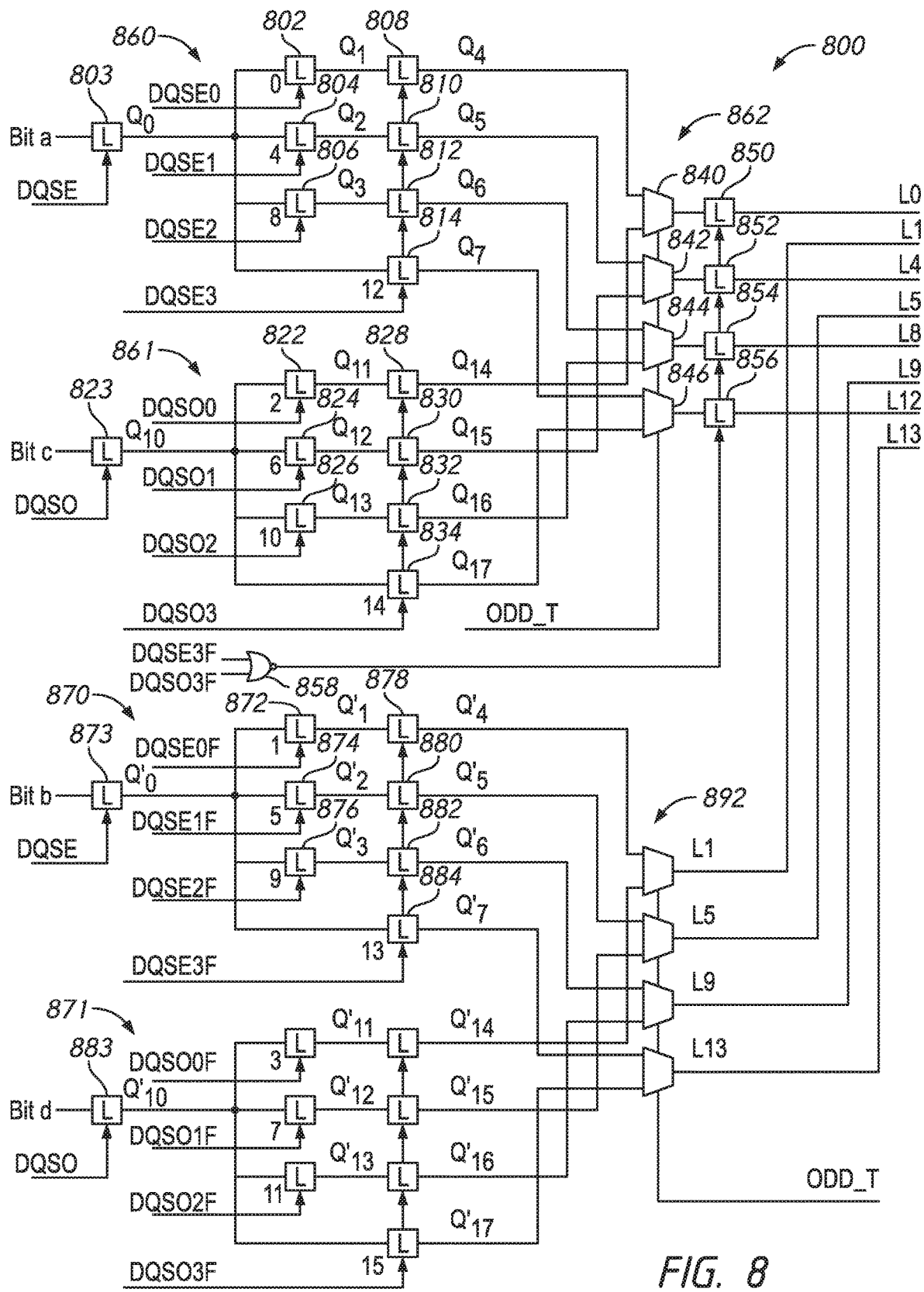
FIG. 8 illustrates a block diagram of full logic circuits for latching data according to some examples described herein.

FIG. 8 illustrates a block diagram of full logic circuits for latching data according to some examples described herein. A circuit 800, which may be implemented in the full logic circuits 602, 604 in FIG. 6, may include a first sub-circuit 860 and second sub-circuit 861. Each of circuits 860 and 861 may be implemented in a full logic circuit, e.g., 602, 604 in FIG. 6. In some examples, circuit 860 may include a plurality of latch circuits, e.g., 802-806, 808-814 configured to latch various data bits in a data burst. Similarly, circuit 861 may include a plurality of latch circuits, e.g., 822-826, 828-834 configured to latch various data bits in a data burst. Circuit 860 may be configured to latch certain bits responsive to rising edges of multiple even DQS signals, whereas circuit 861 may be configured to latch certain bits responsive to rising edges of multiple odd DQS signals. Circuit 800 may also include a selection circuit 862 coupled to both circuit 860 and circuit 861 and configured to switch between output of the two circuits 860, 861 responsive to an even/odd switching signal ODD_T. In some examples, the even/odd switching signal ODD_T may be provided by an example circuit described in FIG. 6.

In some examples, the selection circuit 862 may include multiple multiplexers, e.g., 840-846, each having two inputs that are respectively coupled to a latch circuit in circuit 860 and a latch circuit in circuit 861. For example, multiplexer 840 includes two inputs that are respectively coupled to the output of latch circuit 808 and the output of latch circuit 828. Circuit 800 may also include a plurality of latches 850-856 coupled to the selection circuit 862 to latch the data selected from the selection circuit 862. The latches 850-856 may be clocked by either the even DQS signals (e.g., DQS3EF) or the odd DQS signals (e.g., DQS3OF). In some examples, circuit 800 may include a circuit 858 having two inputs that are respectively coupled to DQS3E (or DQS3EF) and DQS3O (or DQS3OF) signals. As described in this document herein, odd and even DQS signals are active only one at a time, thus circuit 858 may be configured to include an output that corresponds to one of the odd and even DQS signals, e.g., DQ3OF, DQ3EF, when the odd or even DQS signals are active. In some examples, circuit 858 may include a NOR gate having the output coupled to the clock of latches 850-856. In such case, both odd DQS signal DQ3OF and even DQS signal DQ3EF, when active, may cause the plurality of latches 850-856 to latch data bits.

In some examples, each of the first sub-circuit 860 and the second sub-circuit 861 may be similar to circuit 500 or circuit 501 in FIG. 5. For example, in a non-limiting example, circuit 860 may include a first set of latch circuits 802, 804, 806, each coupled to a common data line, e.g., the output of the first input buffer, such as represented as Bit a, to receive data bits in a DQ stream in a serial manner. Each latch circuit 802-806 may also be coupled to a first even DQS signal DQSE0, a second even DQS signal DQSE1 and a third even DQS signal DQSE2, respectively. In some examples, the first set of latches 802-806 may also be configured to propagate data at the common data line responsive to each respective clock signals DQSE, e.g., DQSE0, DQSE1, DQSE2, and hold these data at output of each respective latch.

Circuit 860 may also include a second set of latches, e.g., 808, 810, 812, the input of which is respectively coupled to the output of the first set of latches 802-806. Additionally, the second set of latches may also include an additional latch, e.g., 814 directly coupled to the common data line. The second set of latches, e.g., 808, 810, 812, 814 may be configured to latch data at each respective input responsive to a fourth even DQS signal DQSE3. In some examples, the second set of latches 808, 810, 812, 814 may latch data responsive to a rising edge of DQSE3. When the rising edge of DQSE3 arrives, data bit from the input buffer may subsequently be latched to the output of latch 814, e.g., at Q7. Responding to the same clock signal DQSE3, latches 808, 810, 812 may also propagate data stored at each corresponding latch in the first set of latches 802-806 and latch these data bits to the output of each respective latch, e.g., at Q4-Q6. Consequently, when the rising edge of the fourth DQS signal, e.g., DQSE3 has arrived, all of the data bits at Q4-Q7 may be simultaneously latched in parallel at the output of latches 808-814.

In some examples, circuit 861 may include a first set of latch circuits 822, 824, 826, which may be coupled to a common data line, e.g., the output of the third input circuit, such as represented by Bit c, to receive data bits in a DQ stream in a serial manner. Each latch circuit 822-826 may also be coupled to a first odd DQS signal DQSO0, a second odd DQS signal DQSO1 and a third odd DQS signal DQSO2, respectively.

In some examples, the first set of latches 822-826 may also be configured to propagate the bit data responsive to each respective clock signals DQSO, e.g., DQSO0, DQSO1, DQSO2, and hold these data at output of each respective latch. Circuit 861 may also include a second set of latches, e.g., 828, 830, 832, the input of which is respectively coupled to the output of the first set of latches 822, 824, 826. Additionally, the second set of latches may also include an additional latch, e.g., 834 directly coupled to the common data line from the input buffer. The second set of latches, e.g., 828, 830, 832, 834 may be configured to latch data at each respective input responsive to a fourth odd DQS signal DQSO3. In some examples, the second set of latches 828, 830, 832, 834 may latch data responsive to a rising edge of DQSO3. When the rising edge of DQSO3 arrives, data bit from the input buffer may subsequently be latched to the output of latch 834, e.g., at Q17. Responding to the same clock signal DQSO3, the output of latches 828, 830, 832 may also be propagated and latched at each corresponding latch in the second set of latches 828-834 to provide latched data bits, e.g., at Q11-Q13. Consequently, when the rising edge of the fourth odd DQS signal, e.g., DQSO3 has arrived, all of the data bits at Q14-Q17 may be simultaneously latched in parallel at the output of latches 828, 830, 832, 834.

With reference to FIG. 8, data bits at Q4-Q7 in circuit 860 are latched responsive to active even DQS signals, e.g., DQSE0-3, and data bits at Q14-Q17 in circuit 861 are latched responsive to active odd DQS signals, e.g., DQSO0-3. The output bits from circuits 860, 861 are coupled to the inputs of the multiplexers 840-846 and are multiplexed at these multiplexers, which select either the output data bits responsive to even DQS signals or the output data bits responsive to odd DQS signals based on the ODD_T signal. The multiplexed data bits at the output of multiplexers 840-846 are latched at the output of latches 850-856 responsive to the falling edges of even or odd DQS signal DQS3E or DQS3O.

In some examples, circuit 800 may also include a third sub-circuit 870 and a fourth sub-circuit 871. Each of sub-circuits 870 and 870 has a similar structure as that of circuit 860 or 861, respectively with the difference being that circuits 870 and 871 are latching data bits based on a falling edge of the corresponding DQS signal in circuits 860 and 871. In some examples, circuits 870 and 871 may be implemented in a full logic circuit, e.g., in 604 in FIG. 6. Similar to sub-circuits 860 and 861, sub-circuits 870 and 871 may each include a plurality of latch circuits and configured to latch certain data bits in a data burst. Circuit 870 may be configured to latch certain bits responsive to falling edges of multiple even DQS signals, e.g., DQSE0F, DQSE1F, DQSE2F and DQSE3F, whereas circuit 871 may be configured to latch certain bits responsive to falling edges of multiple odd DQS signals, e.g., DQSO0F, DQSO1F, DQSO2F, and DQSO3F. Circuit 800 may also include a selection circuit 892 coupled to both circuit 870 and circuit 871 and configured to switch between the output of the two circuits 870, 871 responsive to the even/odd switching signal ODD_T.

In some scenarios, selection circuit 892 may include multiple multiplexers, each having a first input coupled to the output of a latch circuit in circuit 870 and a second input coupled to the output of a corresponding latch circuit in circuit 871. Circuit 870 may include a first set of latch circuits, e.g., 872-876, which are coupled to a common data bit line, e.g., output of the second input buffer, e.g., as represented by Bit b. Circuit 871 may also include a first set of latch circuits, which are coupled to a common data bit line, e.g., output of the fourth input buffer, e.g., as represented by Bit d. Similar to circuits 860 and 861, circuit 870 may latch data bits from output of the input buffer, e.g., the second input buffer Bit b when even DQS signals are active. Circuit 871 may latch data bits from output of the input buffer, e.g., the fourth input buffer Bit d when odd DQS signals are active.

With further reference to FIG. 8, circuits 870 and 871 may not need a third set of latch circuits to couple to the output of the selection circuit 892 because circuits 870 and 871 latch data bits responsive to the falling edges of DQS signals. Similar to circuits 860 and 861, when the falling edge of the fourth DQS signal, e.g., DQSE3F or DQSO3F arrives, the output from each multiplexer in selection circuit 892 may set the signal lines L1, L5, L9 and L13. The detailed timing diagrams are further illustrated herein in FIG. 9. Thus, circuits 860, 861, 870 and 871 all finish latching of corresponding data bits from the DQ stream at the falling edge of the last DQS signal, e.g., DQSE3, DQSO3 or the rising edge of DQSE3F and DQSO3F.

In some examples, each of circuits 860, 861, 870 and 871 may include a latch circuit, e.g., 803, 823, 873, and 883 coupled between the first set of latches and the common data line in each circuit. For example, a latch circuit 803 is coupled between the common data line, e.g., Bit a coupled to the output of the first input buffer, and the first set of latches 802-806. Each of the latch circuits 803, 823, 873 and 883 may be clocked by an even/odd DQS signal, e.g., DQSE or DQSO.

Figure 9:
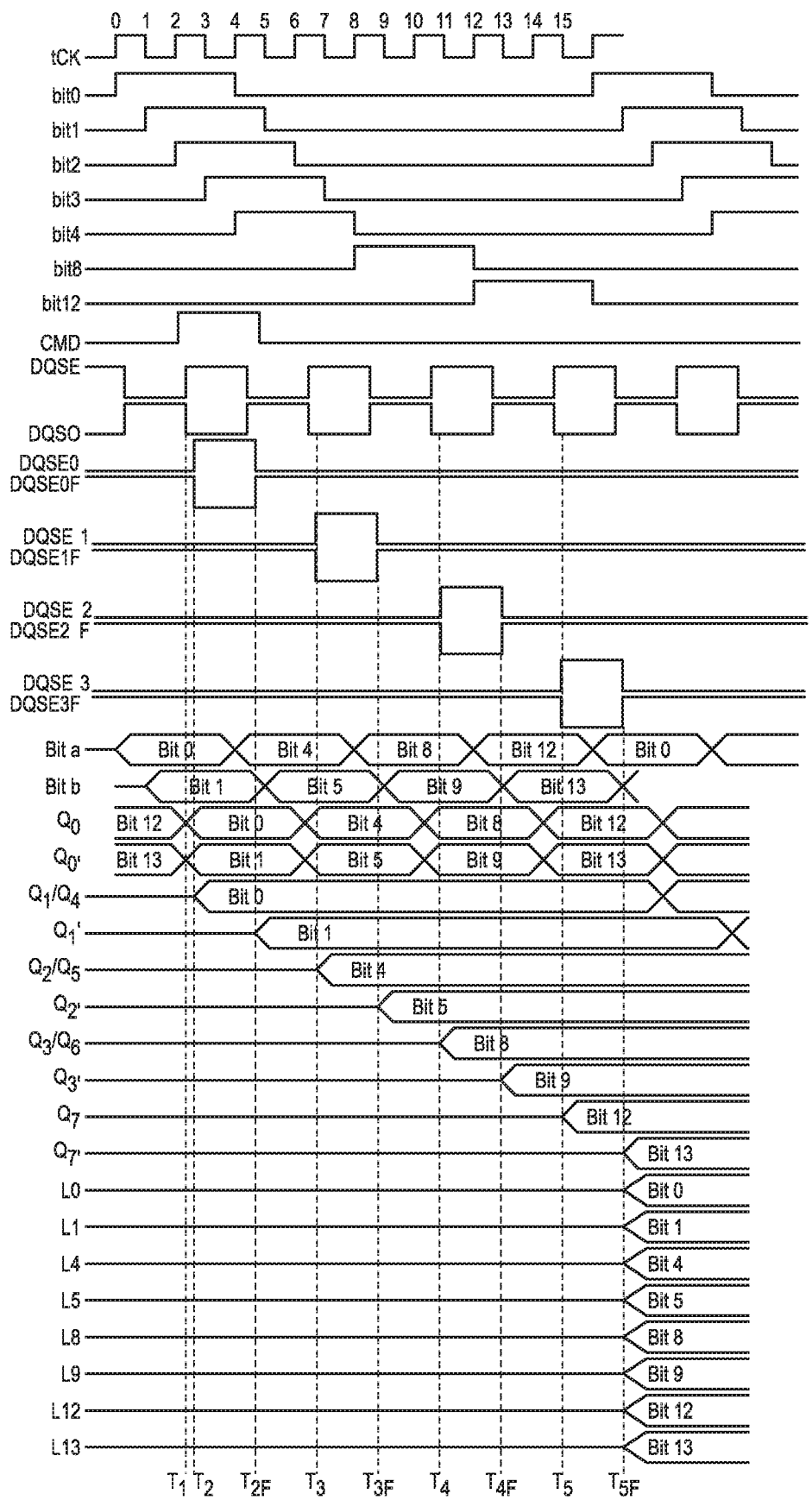
FIG. 9 illustrates a timing diagram for an example serial-to-parallel circuit when even DQS signals are active in accordance with some examples described herein.

FIG. 9 illustrates a timing diagram of an example serial-to-parallel circuit when even DQS signals are active in accordance with some examples described herein. As shown in FIG. 9, bits 0, 4, 8 and 12 are fed from the first input buffer in series, e.g., with output represented as Bit a, and they delay two tCK cycles from each other. Similarly, bits 1, 5, 9 and 13 are fed from the second input buffer in series, e.g., with output represented as Bit b; bits 2, 6, 10 and 14 from the third input buffer as Bit c; and bits 3, 7, 11 and 15 from the fourth input buffer as Bit d. A single DQS even signal, e.g., DQSE and a single DQS odd signal, e.g., DQSO each repeats every two tCK but are complementary to each other. Depending on when the command CMD arrives, DQSE and DQSO may be used to determine if even DQS signals or odd DQS signals fire. For example, when CMD arrives, if a rising edge of DQSE arrives first, the even DQS signals fire (become activated) and odd DQS signals become inactive (e.g., stay at a low logic level). Conversely, if a rising edge of DQSO arrives first, the odd DQS signals fire (become activated) and even DQS signals become inactive (e.g., stay at a low logic level). As shown in FIG. 9, when CMD arrives, a rising edge of DQSE, e.g., at T1, arrives first, and thus DQSE signals, DQSE0, DQSE1, DQSE2, DQSE3 (or inverted signals DQSE0F, DQSE1F, DQSE2F, DQSE3F) fire. In some examples, DQS even signals may be fired with a slight delay from the single DQSE signal, e.g., at T2.

With further reference to FIG. 9 and circuit 860 in FIG. 8, for example, the latch circuit 803 latches data bits 0, 4, 8 and 12 at common data line Q0 at every rising edge of DQSE. Subsequently, when DQSE0-DQSE3 are fired in sequence, data from the common data line Q0 may be propagated through the various set of latches in FIG. 8. For example, at the first rising edge of DQSE0 at T2 (which is slightly delayed from the rising edge of DQSE), latch circuit 802 latches output from Q0, which is bit 0 in the data stream. At T3, the rising edge of DQSE1, the next data bit from Q0, e.g., bit 4, is latched at Q2. At T4, the rising edge of DQSE2, the next data bit from Q0, e.g., bit 8, is latched at Q3. At T5, the rising edge of DQSE3, all of the data bits 0, 4, 8 and 12, are respectively latched at Q4, Q5, Q6 and Q7. These data bits at Q4-Q7 are further multiplexed by circuit 862 in FIG. 8. Because even DQS signals are active, ODD_T causes the selection circuit 862 to select output from corresponding circuit 860, thus data bits 0, 4, 8 and 12 are multiplexed and latched at latched data lines L0, L4, L8 and L12, respectively.

With further reference to FIG. 8, circuit 870 operates similar to circuit 860 except that the serial data bits are fed from the second input buffer (e.g., Bit b), which may contain bits 1, 5, 9 and 14 in the DQ stream. These bits are sequentially latched at the falling edge of each DQSE signal, e.g., at time T2F, T3F, T4F and T5F, respectively. At time T5F, the falling edge of DQSE3 (or rising edge of DQSE3F), data bits 1, 5, 9 and 13 are respectively latched at output Q'4-Q'7 and further multiplexed at selection circuit 892 to provide output bits 1, 5, 9 and 13 in parallel. As shown, circuits 860 and 870 latch bits 0, 1, 4, 5, 8, 9, 12 and 13 in parallel at L0, L1, L4, L5, L8, L9, L12 and L13, respectively. Now, the remaining data bits in a 16-bit data burst are latched using half circuits, e.g., 610, 612 in FIG. 6, the timings of which are further described herein.

Figure 10:
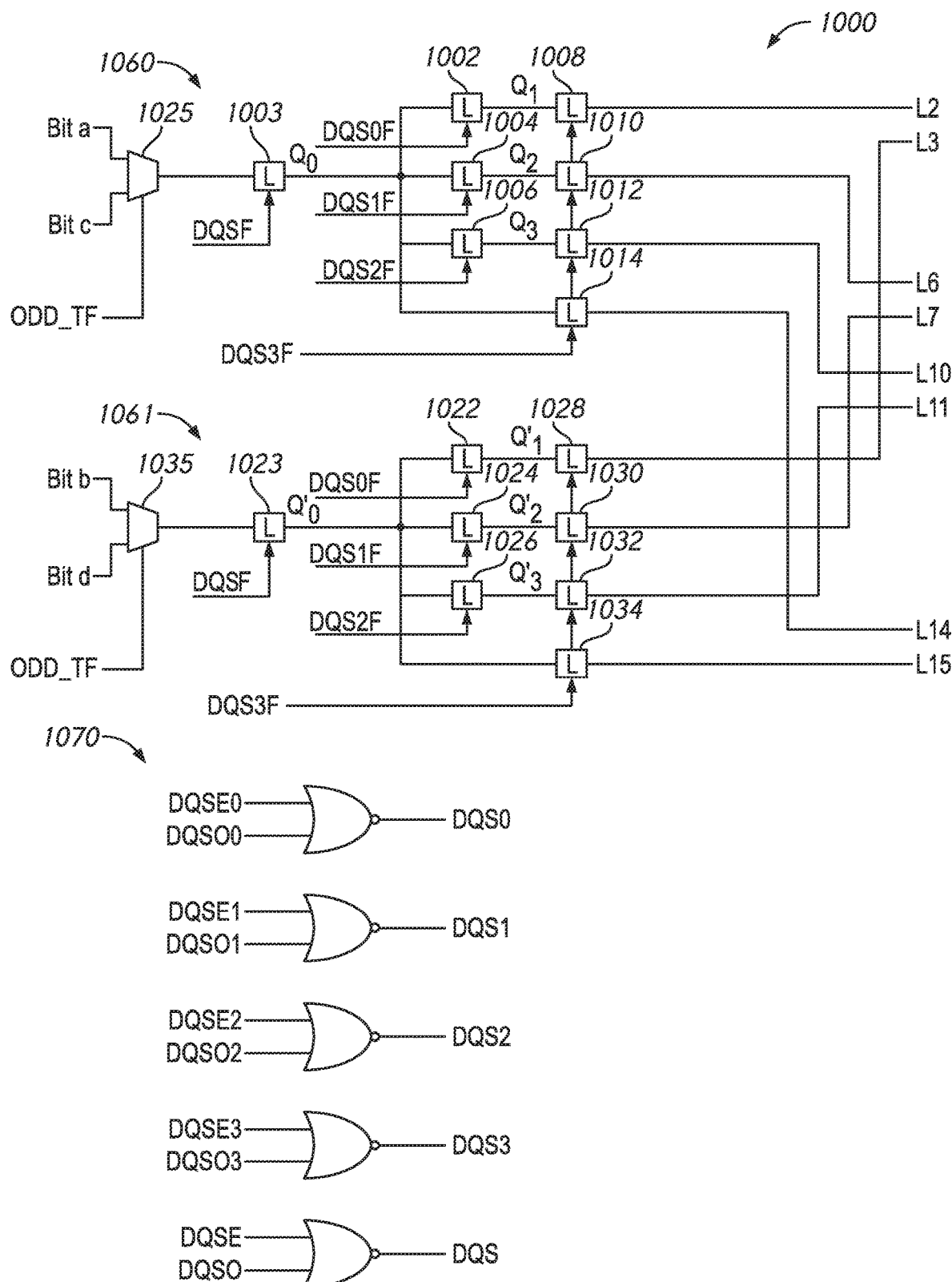
FIG. 10 illustrates a block diagram of example half logic circuits for latching data according to some examples described herein.

FIG. 10 illustrates a block diagram of example half logic circuits for latching data according to some examples described herein. In some examples, a circuit 1000 may include a sub-circuit 1060 and a sub-circuit 1061. Each of the sub-circuits 1060, 1061 may be implemented in a half logic circuit 610 or 612 in FIG. 6. Circuits 1060 and 1061 may each include a plurality of latch circuits, e.g., 1002-1006, 1022-1026 configured to latch various data bits in a data burst. Circuit 1060 may be configured to latch certain bits responsive to rising edges of multiple DQS signals, whereas circuit 1061 may be configured to latch certain bits responsive to falling edges of multiple DQS signals (or rising edge of multiple complementary DQS signals).

In a non-limiting example, circuit 1060 may include a first set of latch circuits 1002, 1004, 1006, which are coupled to a common data line Q0 that receives the output of a multiplexer 1025. Multiplexer 1025 may have a first input and second input each coupled to a respective input buffer. In some examples, multiplexer 1025 may be coupled to the first and third input buffer to receive Bit a and Bit c, respectively from the DQ data stream. Each of the first latch circuits 1002, 1004, 1006 may be clocked by a respective DQS signal, e.g., DQS0, DQS1 and DQS2. As shown in FIG. 10, a circuit 1070 may include multiple logic gates to provide each DQS signal. For example, DQS0, DQS1, DQS2, and DQS3 may each be provided by an OR gate configured to perform the logic OR operation on corresponding even and odd DQS signals. For example, DQS0 is the output of an OR operation on DQSE0 and DQSO0 signals.

Each of the latch circuits 1002-1006 may be configured to latch a data bit from the common data line Q0 responsive to a rising edge of one of the DQS signals, DQS0-DQS2. Circuit 1060 may further include a second set of latches 1008-1012 coupled to a respective latch circuit 1002, 1004, 1006. The second set of latches may also include an additional latch circuit 1014 coupled to the common data line Q0. Each of the second set of latches 1008-1014 may be clocked by the third DQS signal, e.g., DQS3, and configured to latch each respective data responsive to a falling edge of DQS3 (or DQS3F, the complementary of DQS3). When the falling edge of DQS3 (or rising edge of DQS3F) arrives, four data bits from the first input buffer (e.g., Bit a) or the third input buffer (e.g., Bit c) will be latched at the latched data lines L2, L6, L10 and L14 in FIG. 10.

Multiplexer 1025 may be configured to select data bits in Bit a or Bit c based on an even/odd switch signal, such as ODD_TF, the complementary of ODD_T signal. Similar to circuit 860 in FIG. 8, circuit 1060 may include an additional latch circuit 1003 coupled between the common bit line Q0 and the output of the multiplexer 1025, and is clocked to a DQS signal. As shown in FIG. 10, DQS signal may be provided through a logic OR operation on DQSE and DQSO, a timing diagram of which is shown in FIG. 9.

Similar to circuit 1060, circuit 1061 may include a first set of latch circuits 1022-1026, which are coupled to a common data line Q'0 that receives the output of a multiplexer 1035. Multiplexer 1035 may have a first input and second input each coupled to a respective input buffer. In some examples, multiplexer 1035 may be coupled to the second and fourth input buffer to receive Bit b and Bit d, respectively from the DQ data stream. Each of the first latch circuits 1022-1026 may be clocked by a respective DQS signal, e.g., DQS0F, DQS1F and DQS2F, which are complementary signals of DQS0, DQS1, and DQS2, respectively. Each of the latch circuits 1022-1026 may be configured to latch a data bit from the common data line Q'0 responsive to a falling edge of one of the DQS signals, DQS0-DQS2, or rising edge of one of DQS0F-DQS2F signals. Circuit 1061 may further include a second set of latches 1028-1032 coupled to a respective latch circuit 1022, 1024, 1026. The second set of latches may also include an additional latch circuit 1034 coupled to the common data line Q'0. Each of the second set of latches 1028-1034 may be clocked by the third complementary DQS signal, e.g., DQS3F, and configured to latch each respective data responsive to a falling edge of DQS3, or a rising edge of DQS3F.

As shown in FIG. 10, circuits 1060 and 1061 all finish latching corresponding data bits from the DQ stream at the falling edge of the last DQS signal, e.g., DQS3, or the rising edge of DQS3F. When the falling edge of DQS3 (or rising edge of DQS3F) arrives, e.g., in circuit 1061, four data bits from the second input buffer (e.g., Bit b) or the fourth input buffer (e.g., Bit d) will be latched at the latched data lines L3, L7, L11 and L15 in FIG. 10.

Multiplexer 1035 may be configured to select data bits in Bit b or Bit d based on the complementary even/odd switch signal ODD_TF. Similar to circuit 1060, circuit 1061 may include an additional latch circuit 1023 coupled between the common data line Q'0 and the output of the multiplexer 1035, and is clocked to a DQS signal.

Figure 11:
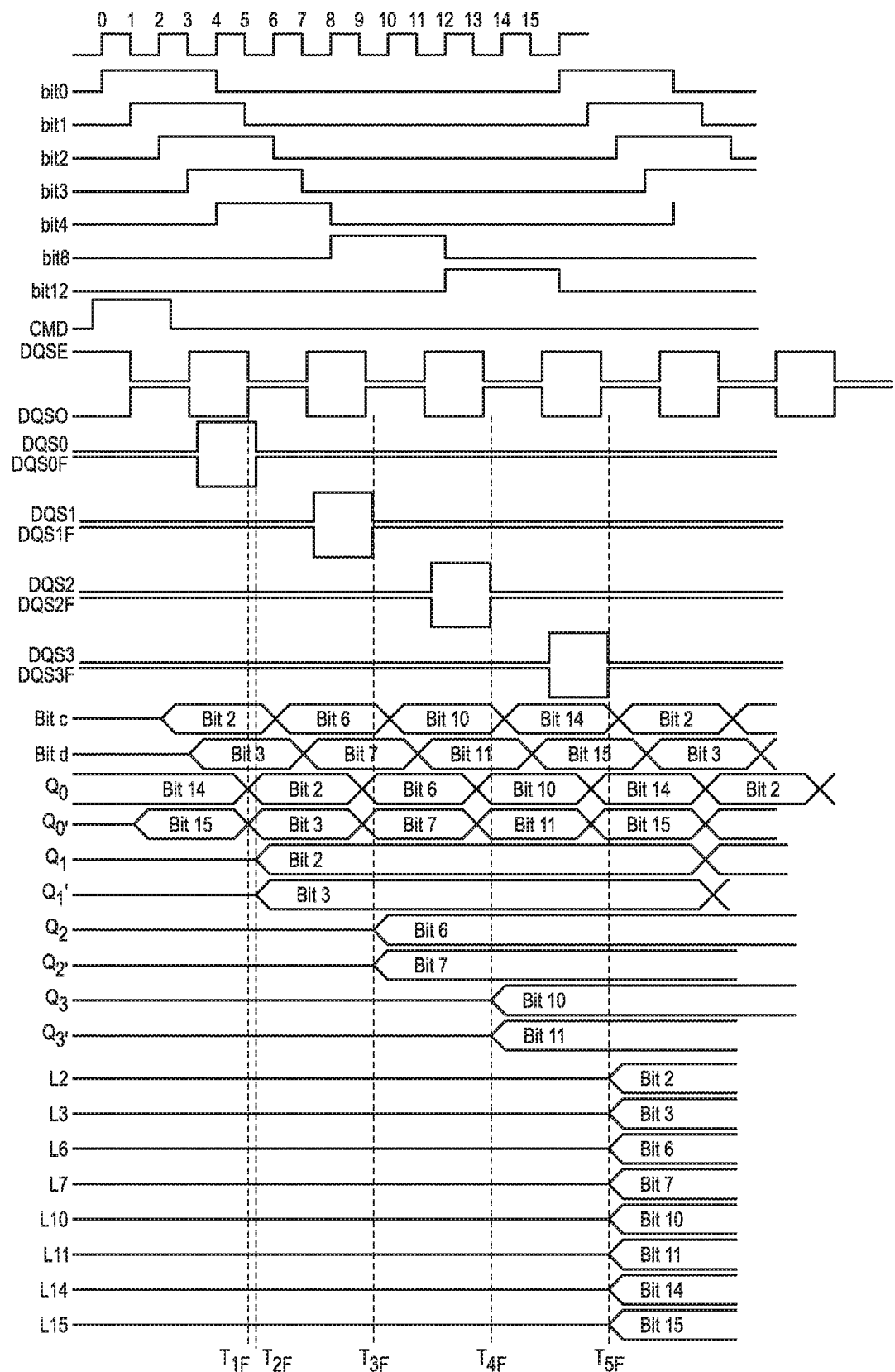
FIG. 11 illustrates a timing diagram for an example serial-to-parallel circuit when even DQS signals are active in accordance with some examples described herein.

FIG. 11 illustrates a timing diagram of an example serial-to-parallel circuit when even DQS signals are active in accordance with some examples described herein. As shown in FIG. 11, bits 2, 6, 10 and 14 are fed from the third input buffer in series, e.g., with output represented as Bit c, and they delay two tCK cycles from each other. Similarly, bits 3, 7, 11 and 15 are fed from the fourth input buffer in series, e.g., with output represented as Bit d. A single DQS even signal, e.g., DQSE and a single DQS odd signal, e.g., DQSO each repeats every two tCK but are complementary to each other. DQSE and DQSO may be used to set ODD_T for the multiplexers 1025/1035 to give time before bits 2 and 3 are latched. As shown in FIG. 11, when CMD arrives, DQSE signals, DQSE0, DQSE1, DQSE2, DQSE3 (or inverted signals DQSE0F, DQSE1F, DQSE2F, DQSE3F) fire. Consequently, DQS0-DQS3, which may be provided by a circuit such as circuit 1070 shown in FIG. 10, also fire and are in sync with DQSE0-DQSE3, respectively. DQS signal is also ready based on DQSE. In some examples, DQS0-3 signals may be fired with a slight delay, e.g., at T2F, from the single DQS even signal at time T1F.

With further reference to FIG. 11 and circuit 1060 in FIG. 10, for example, after CMD arrives, the even/odd switching signal ODD_TF causes the multiplexer 1025 to switch to the second input, e.g., the output from the third input buffer as represented by Bit c. The latch circuit 1003 latches data bits 2, 6, 10 and 14 at common data line Q0 at every falling edge of DQS. Subsequently, when DQS0-DQS3 are fired in sequence, data from the common data line Q0 may be propagated through the multiple sets of latches in FIG. 10. For example, at the falling edge of DQS, latch circuit 1003 latches data bits from Bit c at Q0 at time T1F. At the first falling edge of DQSO at T2F (which is slightly delayed from the falling edge of DQSE), latch circuit 1002 latches data from Bit c, e.g., bit 2, at Q1 responsive to the DQS signal. At T3F, the falling edge of DQS1, the next data bit from Q0, e.g., bit 6, is latched at Q2. At T4F, the falling edge of DQS2, the next data bit from Q0, e.g., bit 10, is latched at Q3. At T5F, the falling edge of DQS3, all of the data bits 2, 6, 10 and 14, are respectively latched bit lines at L2, L6, L10 and L14.

With further reference to FIG. 11, circuit 1061 operates similar to circuit 1060 except that the serial data bits are fed from the fourth input buffer (e.g., Bit d) when DQS even signals are active. The data bits from the fourth input buffer may contain bits 3, 7, 11 and 15 in the DQ stream. These bits are sequentially latched at the falling edge of each DQS signal DQS0, DQS1, DQS2, DQS3 (or rising edge of each complementary signal DQS0F, DQS1F, DQS2F, DQS3F), e.g., at time T2F, T3F, T4F and T5F, respectively. At time T5F, the falling edge of DQS3 (or rising edge of DQS3F), data bits 3, 7, 11 and 15 are respectively latched at L3, L7, L11 and L15 to provide output bits 3, 7, 11 and 15 in parallel. As shown, circuits 1060 and 1061 latch bits 2, 3, 6, 7, 10, 11, 14 and 15 in parallel at L2, L3, L6, L7, L10, L11, L14 and L15, respectively. With the data bits latched in circuit 800, all 16 bits in the DQ stream are latched at time T5F.

Figure 12:
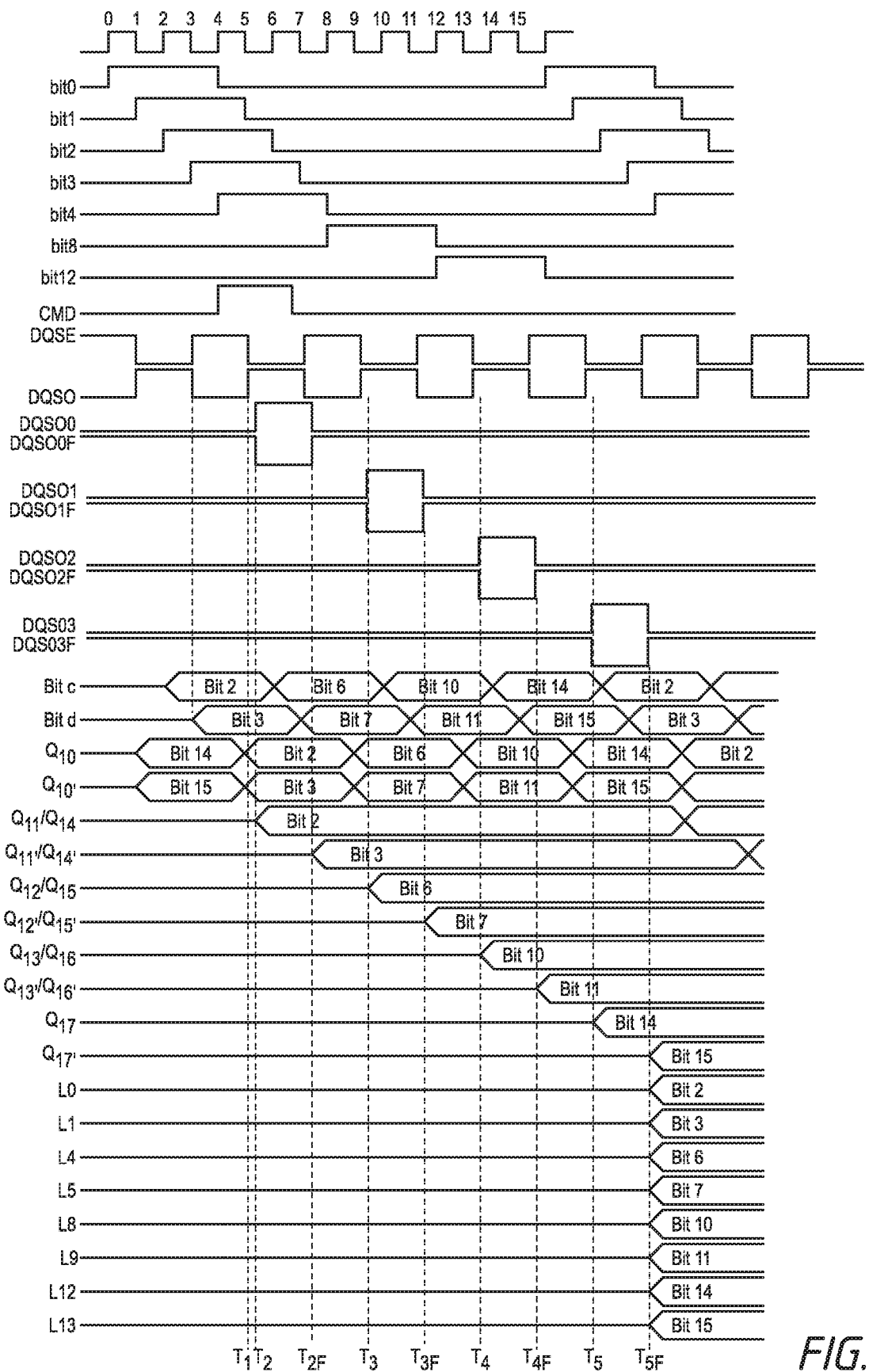
FIGS. 12-13 illustrate timing diagrams for an example serial-to-parallel circuit when odd DQS signals are active in accordance with some examples described herein.
Figure 13:
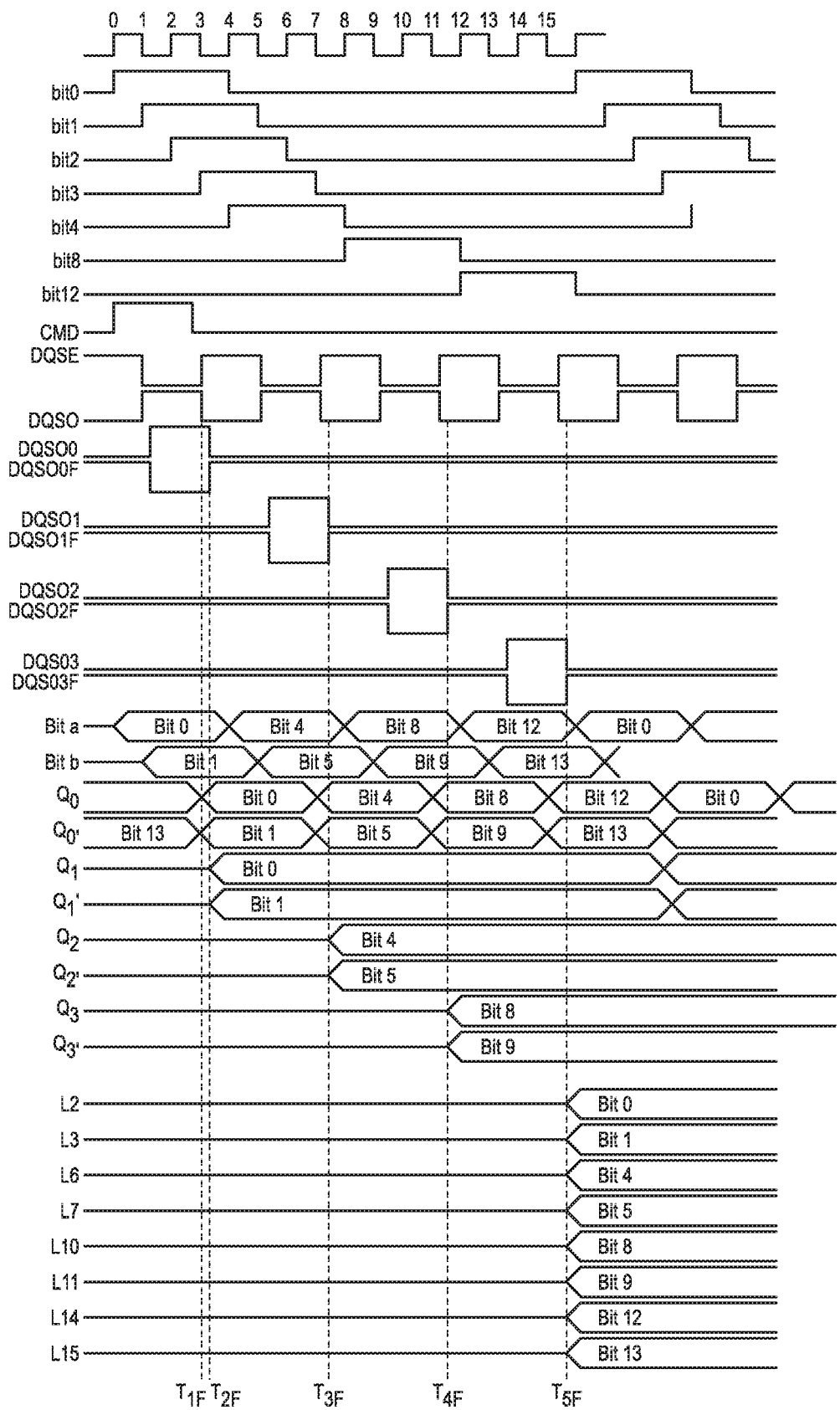

FIGS. 12-13 illustrate timing diagrams of an example serial-to-parallel circuit when odd DQS signals are active in accordance with some examples described herein. As shown in FIG. 12, bits 2, 6, 10 and 14 are fed from the third input buffer in series, e.g., with output represented as Bit c, and they delay two tCK cycles from each other. Similarly, bits 3, 7, 11 and 15 are fed from the second input buffer in series, e.g., with output represented as Bit d. A single DQS even signal, e.g., DQSE and a single DQS odd signal, e.g., DQSO each repeats every two tCK but are complementary to each other. Depending on when the command CMD arrives, DQSE and DQSO may be used to determine if even DQS signals or odd DQS signals fire. For example, as shown in FIG. 12, when CMD arrives, a rising edge of DQSO, e.g., at T1, arrives first, and thus DQSO signals, e.g., DQSO0, DQSO1, DQSO2, DQSO3 (or inverted signals DQSO0F, DQSO1F, DQSO2F, DQSO3F) fire. In some examples, DQS odd signals may be fired with a slight delay from the single DQSO signal, e.g., at T2.

With further reference to FIG. 12 and circuit 861 in FIG. 8, for example, the latch circuit 823 latches data bits 2, 6, 10 and 14 at common data line Q10 at every rising edge of DQSO. Subsequently, when DQSO0-DQSO3 are fired in sequence, data from the common data line Q10 may be propagated through the various set of latches in FIG. 8. For example, at the first rising edge of DQSO0 at T2 (which is slightly delayed from the rising edge of DQSO), latch circuit 822 latches output from Q10, which is bit 2 in the data stream. At T3, the rising edge of DQSO1, the next data bit from Q10, e.g., bit 6, is latched at Q12. At T4, the rising edge of DQSO2, the next data bit from Q10, e.g., bit 10, is latched at Q3. At T5, the rising edge of DQSO3, all of the data bits 2, 6, 10 and 14, are respectively latched at Q14, Q15, Q16 and Q17. These data bits at Q14-Q17 are further multiplexed by circuit 862 in FIG. 8. Because odd DQS signals are active, ODD_T causes the selection circuit 862 to select output from corresponding circuit 861, thus data bits 2, 6, 10 and 14 are multiplexed and latched at latched data lines L1, L5, L9 and L13, respectively.

With further reference to FIG. 8, circuit 871 operates similar to circuit 861 except that the serial data bits are fed from the fourth input buffer (e.g., Bit d), which may contain bits 3, 7, 11 and 15 in the DQ stream. These bits are sequentially latched at the falling edge of each DQSO signal, e.g., at time T2F, T3F, T4F and T5F, respectively. At time T5F, the falling edge of DQSO3 (or rising edge of DQSO3F), data bits 3, 7, 11 and 15 are respectively latched at output Q'14-Q'17 and further multiplexed at selection circuit 892 to provide output bits 3, 7, 11 and 15 in parallel. As shown, circuits 861 and 871 latch bits 2, 3, 6, 7, 10, 11, 14 and 15 in parallel at latched data lines L0, L1, L4, L5, L8, L9, L12 and L13, respectively. Now, the remaining data bits in a 16-bit data burst are latched using half circuits, e.g., 610, 612 in FIG. 6, the timing diagrams of which are further described herein.

As shown in FIG. 12, bits 0, 4, 8, and 12 are fed from the first input buffer in series, e.g., with output represented as Bit a, and they delay two tCK cycles from each other. Similarly, bits 1, 5, 9 and 13 are fed from the second input buffer in series, e.g., with output represented as Bit b. When the command CMD arrives, DQSE and DQSO may be used to determine if even DQS signals or odd DQS signals fire. For example, as shown in FIG. 13, when CMD arrives, a rising edge of DQSO arrives first, and thus DQSO signals, DQSO0, DQSO1, DQSO2, DQSO3 (or inverted signals DQSO0F, DQSO1F, DQSO2F, DQSO3F) fire. Consequently, DQS0-DQS3, which may be provided by a circuit such as circuit 1070 shown in FIG. 10, also fire and are in sync with DQSO0-DQSO3, respectively. DQS is ready based on DQSO. In some examples, DQS0-3 signals may be fired with a slight delay, e.g., at time T2F, from the single DQS odd signal at time T1F.

With further reference to FIG. 13 and circuit 1061 in FIG. 10, for example, when DQS odd signals fire, the even/odd switching signal ODD_TF causes the multiplexer 1025 to switch to the second input, e.g., the output from the first input buffer as represented by Bit a. The latch circuit 1003 latches data bits 0, 4, 8 and 12 at common data line Q0 at every falling edge of DQS. Subsequently, when DQS0-DQS3 are fired in sequence, data from the common data line Q0 may be propagated through the multiple sets of latches in FIG. 10. For example, at the first falling edge of DQS0 at T2F (which is slightly delayed from the falling edge of DQS0), latch circuit 1002 latches data from Bit a, e.g., bit 0, at Q1 responsive to the DQS signal. At T3F, the falling edge of DQS1, the next data bit from Q0, e.g., bit 4, is latched at Q2. At T4F, the falling edge of DQS2, the next data bit from Q0, e.g., bit 8, is latched at Q3. At T5F, the falling edge of DQS3, all of the data bits 0, 4, 8 and 12, are respectively latched at latched data lines L2, L6, L10 and L14, responsive to the falling edge of DQS3, or rising edge of DQS3F.

With further reference to FIG. 13, circuit 1061 operates similar to circuit 1060 except that the serial data bits are fed from the second input buffer (e.g., Bit b) when DQS even signals are active. The data bits from the second input buffer may contain bits 1, 5, 9 and 13 in the DQ stream. These bits are sequentially latched at the falling edge of each DQS signal DQS0, DQS1, DQS2, DQS3 (or rising edge of each complementary signal DQS0F, DQS1F, DQS2F, DQS3F), e.g., at time T2F, T3F, T4F and T5F, respectively. At time T5F, the falling edge of DQS3 (or rising edge of DQS3F), data bits 1, 5, 9 and 13 are respectively latched at L3, L7, L11 and L15 to provide output bits 3, 7, 11 and 15 in parallel. As shown, circuits 1060 and 1061 latch bits 0, 1, 4, 5, 8, 9, 12 and 13 in parallel at L2, L3, L6, L7, L10, L11, L14 and L15, respectively. With the data bits latched in circuit 800, all 16 bits in the DQ stream are latched at time T5F.

As shown in FIGS. 8-13, when a DQ stream has a 16-bit burst length, for example, the serial-to-parallel circuit may include multiple full logic circuits, e.g., 860, 861 and 870, 871 in FIG. 8, to latch eight bits in parallel; and multiple half logic circuits, e.g. 1060 and 1061 in FIG. 10, to latch remaining bits in parallel. Each of the full logic and half logic circuits use both a rising edge and a falling edge of the same DQS signal. This provides advantages of eliminating the need to delay certain data lines from the input buffer as required in latching data bits using rising edges only or falling edges only and thus reduces circuit complexity and power consumption of the semiconductor device.

From the foregoing it will be appreciated that, although specific embodiments of the disclosure have been described herein for purposes of illustration, various modifications or combinations of various features may be made without deviating from the spirit and scope of the disclosure. Accordingly, the disclosure is not limited except as by the appended claims.

What is claimed is:

1. An apparatus comprising:
a plurality of input buffers, each configured to receive multiple data bits in a serial data stream;
a first circuit including a first input coupled to a first input buffer of the plurality of input buffers and further including a second input coupled to a second input buffer of the plurality of input buffers, the first circuit is configured to receive a DQS signal and to latch a first data bit of the multiple data bits selected from the first input buffer or the second input buffer responsive to the DQS signal; and
a second circuit including a first input coupled to the first input buffer and further including a second input coupled to the second input buffer, the second circuit is configured to receive the DQS signal and to latch a second data bit of the multiple data bits selected from the first input buffer or the second input buffer responsive to the DQS signal;
wherein the first circuit is configured to latch the first data bit responsive to a first clock edge of the DQS signal and the second circuit is configured to latch the second data bit responsive to a second clock edge of the DQS signal opposite in direction to the first clock edge.

2. The apparatus of claim 1 further comprising:
a third circuit including a first input coupled to a third input buffer of the plurality of input buffers and further including a second input coupled to a fourth input buffer of the plurality of input buffers, the third circuit is configured to receive the DQS signal and to latch a third data bit of the multiple data bits selected from the third input buffer or the fourth input buffer responsive to the DQS signal; and
a fourth circuit including a first input coupled to the third input buffer and further including a second input coupled to the fourth input buffer, the third circuit is configured to receive the DQS signal and to latch a fourth data bit of the multiple data bits selected from the third input buffer or the fourth input buffer responsive to the DQS signal.

3. The apparatus of claim 2, wherein the third circuit is configured to latch the third data bit responsive to the first clock edge of the DQS signal and the fourth circuit is configured to latch the fourth data bit responsive to the second clock edge of the DQS signal.

4. The apparatus of claim 1, wherein, responsive to an even/odd switching signal:
the first circuit is configured to latch the first data bit selected from the first input buffer and the second circuit is configured to latch the second data bit selected from the second input buffer; or
the first circuit is configured to latch the first data bit selected from the second input buffer and the second circuit is configured to latch the second data bit selected from the first input buffer.

5. The apparatus of claim 1, wherein the first circuit comprises:
a first sub-circuit configured to receive a first plurality of data bits of the multiple data bits from the first input buffer and configured to latch the first plurality of data bits from the first input buffer responsive to the DQS signal;
a second sub-circuit configured to receive a second plurality of data bits of the multiple data bits from the second input buffer and configured to latch the second plurality of data bits from the second input buffer responsive to the DQS signal; and
a selection circuit coupled to the first sub-circuit and the second sub-circuit and configured to select an output from one of the first sub-circuit and the second sub-circuit responsive to an even/odd switching signal that is provided based on the DQS signal.

6. The apparatus of claim 5, wherein the DQS signal comprises a plurality of even DQS signals and a plurality of odd DQS signals, one of the plurality of even DQS signals and the plurality of odd DQS signals are set active during an initialization of the apparatus, and wherein:
when the plurality of even DQS signals are active, the selection circuit is configured to select the output from the first sub-circuit; and
when the plurality of odd DQS signals are set active, the selection circuit is configured to select the output from the second sub-circuit.

7. The apparatus of claim 6, wherein the first sub-circuit comprises:
a first set of latches configured to receive the first plurality of data bits from the first input buffer, each of the first set of latches is configured to latch one of the first plurality of data bits from the first input buffer responsive to a corresponding even DQS signal in the plurality of even DQS signals; and
a second set of latches configured to latch simultaneously the first plurality of data bits from the first set of latches responsive to a last even DQS signal in the plurality of even DQS signals.

8. The apparatus of claim 7, wherein the second sub-circuit comprises:
a third set of latches configured to receive the second plurality of data bits from the second input buffer, each of the third set of latches is configured to latch one of the second plurality of data bits from the second input buffer responsive to a corresponding odd DQS signal in the plurality of odd DQS signals; and
a fourth set of latches configured to latch simultaneously the second plurality of data bits from the third set of latches responsive to a last odd DQS signal in the plurality of odd DQS signals.

9. The apparatus of claim 8, wherein the first circuit further comprises:
a fifth set of latches configured to latch the output from the selection circuit responsive to the last even DQS signal or the last odd DQS signal;
wherein:
the second set of latches in the first sub-circuit are configured to latch the first plurality of data bits from the first set of latches responsive to the last even DQS signal; and
the fourth set of latches in the second sub-circuit are configured to latch the second plurality of data bits from the third set of latches responsive to the last odd DQS signal.

10. The apparatus of claim 6, wherein:
each even DQS signal in the plurality of even DQS signals is delayed in sequence from a preceding even DQS signal by a delay time between two succeeding data bits in the first input buffer; and
each odd DQS signal in the plurality of odd DQS signals is delayed in sequence from a preceding odd DQS signal by the delay time between the two succeeding data bits in the first input buffer.

11. The apparatus of claim 2, wherein the third circuit comprises:
a first sub-circuit configured to receive a third plurality of data bits of the multiple data bits from the third input buffer and configured to latch the third plurality of data bits from the third input buffer responsive to the DQS signal;

a second sub-circuit configured to receive a fourth plurality of data bits of the multiple data bits from the fourth input buffer and configured to latch the fourth plurality of data bits from the fourth input buffer responsive to the DQS signal; and
a selection circuit coupled to the first sub-circuit and the second sub-circuit and configured to select output from one of the first sub-circuit and the third sub-circuit responsive to an even/odd switching signal that is provided based on the DQS signal.

12. The apparatus of claim 11, wherein the DQS signal comprises a plurality of even DQS signals and a plurality of odd DQS signals, one of the plurality of even DQS signals and the plurality of odd DQS signals are set active during an initialization of the apparatus, and wherein:
when the plurality of even DQS signals are active, the selection circuit is configured to select the output from the first sub-circuit; and
when the plurality of odd DQS signals are active, the selection circuit is configured to select the output from the second sub-circuit.

13. The apparatus of claim 6, wherein the second circuit comprises:
a multiplexer including a first input coupled to the first input buffer and further including a second input coupled to the second input buffer, the multiplexer is configured to select data bits from one of the first input buffer and the second input buffer responsive to the even/odd switching signal.

14. The apparatus of claim 13, wherein:
when the plurality of even DQS signals are active, the multiplexer circuit is configured to select the data bits from the second input buffer; and
when the plurality of odd DQS signals are active, the selection circuit is configured to select the data bits from the first input buffer.

15. The apparatus of claim 12, wherein the fourth circuit comprises:
a multiplexer including a first input coupled to the third input buffer and further including a second input coupled to the fourth input buffer, the multiplexer is configured to select data bits from one of the third input buffer and the fourth input buffer responsive to the even/odd switching signal.

16. The apparatus of claim 15, wherein:
when the plurality of even DQS signals are active, the multiplexer circuit is configured to select the data bits from the fourth input buffer; and
when the plurality of odd DQS signals are active, the selection circuit is configured to select the output from the third input buffer.

\* \* \* \* \*